(12) United States Patent
Constantz

(10) Patent No.: US 10,716,244 B2
(45) Date of Patent: Jul. 14, 2020

(54) WATER COOLED FACILITIES AND ASSOCIATED METHODS

(71) Applicant: DeepWater Desal LLC, Moss Landing, CA (US)

(72) Inventor: Brent R. Constantz, Portola Valley, CA (US)

(73) Assignee: DeepWater Desal LLC, Moss Landing, CA (US)

(*) Notice: Subject to any disclaimer, the term of this patent is extended or adjusted under 35 U.S.C. 154(b) by 549 days.

(21) Appl. No.: 14/852,279

(22) Filed: Sep. 11, 2015

(65) Prior Publication Data

US 2016/0076804 A1   Mar. 17, 2016

Related U.S. Application Data

(60) Provisional application No. 62/051,220, filed on Sep. 16, 2014.

(51) Int. Cl.

| | | |
|---|---|---|
| *H05K 7/20* | (2006.01) | |
| *C02F 1/44* | (2006.01) | |
| *C02F 103/02* | (2006.01) | |
| *C02F 1/04* | (2006.01) | |
| *C02F 1/06* | (2006.01) | |
| *C02F 103/08* | (2006.01) | |

(52) U.S. Cl.
CPC .......... *H05K 7/2079* (2013.01); *C02F 1/441* (2013.01); *C02F 1/04* (2013.01); *C02F 1/048* (2013.01); *C02F 1/06* (2013.01); *C02F 2103/023* (2013.01); *C02F 2103/08* (2013.01)

(58) Field of Classification Search
None
See application file for complete search history.

(56) References Cited

U.S. PATENT DOCUMENTS

| | | |
|---|---|---|
| 5,979,363 A | 11/1999 | Shaar |
| 6,833,056 B1 | 12/2004 | Kamiya et al. |
| 7,525,207 B2 | 4/2009 | Clidaras et al. |
| 7,886,537 B2 | 2/2011 | Jagusztyn et al. |
| 8,322,139 B2 | 12/2012 | Takahashi et al. |
| 8,567,195 B2 | 10/2013 | Nash |

(Continued)

FOREIGN PATENT DOCUMENTS

| | | |
|---|---|---|
| GB | 1260214 A | 1/1972 |
| GB | 2400603 A | 10/2004 |

(Continued)

OTHER PUBLICATIONS

Briand, Effects of power-plant cooling systems on marine phytoplankton, Marine Biology (1975), 33(2):135-146, Abstract Only.

(Continued)

*Primary Examiner* — Krishnan S Menon
(74) *Attorney, Agent, or Firm* — Bret E. Field; Bozicevic, Field & Francis LLP

(57) ABSTRACT

The present disclosure provides facilities having water cooling subsystems and multi-lumen conduits coupled thereto. Also provided are methods of cooling facilities by, for example, receiving cool water into a water cooling subsystem of a facility and outputting warm water from the water cooling subsystem.

11 Claims, 5 Drawing Sheets

(56) References Cited

U.S. PATENT DOCUMENTS

| | | | |
|---|---|---|---|
| 2004/0206681 A1* | 10/2004 | Gordon | B01D 61/025 |
| | | | 210/259 |
| 2007/0023163 A1* | 2/2007 | Kidwell | F24J 3/084 |
| | | | 165/45 |
| 2007/0131534 A1 | 6/2007 | Capan | |
| 2009/0078401 A1 | 3/2009 | Cichanowicz | |
| 2009/0230686 A1 | 9/2009 | Catlin | |
| 2009/0295167 A1* | 12/2009 | Clidaras | F03B 13/20 |
| | | | 290/55 |
| 2012/0011849 A1 | 1/2012 | Cole et al. | |
| 2012/0055857 A1 | 3/2012 | Marin et al. | |
| 2012/0091729 A1 | 4/2012 | Nash | |
| 2012/0247149 A1 | 10/2012 | Labelle | |
| 2013/0042612 A1 | 2/2013 | Shapiro et al. | |

FOREIGN PATENT DOCUMENTS

| | | | |
|---|---|---|---|
| JP | 01219360 A | * | 9/1989 |
| JP | 2010-267707 A | | 11/2010 |
| KR | 1000954233 B1 | | 4/2010 |
| KR | 10-2011-0037589 | | 4/2011 |
| KR | 10-2011-0075384 | | 7/2011 |
| KR | 10-2011-0138319 A | | 12/2011 |
| WO | WO2011047482 A1 | | 4/2011 |
| WO | WO2013184820 A1 | | 12/2013 |
| WO | WO2014151044 A1 | | 9/2014 |
| WO | WO2014151058 A1 | | 9/2014 |

OTHER PUBLICATIONS

Emura et al., Pumping of Low-Temperature Deep Sea Water for Cooling of Facilities on Land, OCEANS '83, Proceedings, Aug. 29-Sep. 1, 1983, San Francisco, p. 871-874, Abstract Only.

Nakasone et al., The Application of Deep Sea Water in Japan, UJNR Technical Report No. 28, p. 69-75, Accessed on Jan. 21, 2015.

Smith, The AC of Tomorrow? Tapping Deep Water for Cooling, National Geographic News (2004), http://news.nationalgeographic.com/news/2004/09/0910_040910_deeplake_2.html, 3 pages.

Makai Ocean Engineering, http://www.makai.com/pipelines/ac-pipelines/, 8 pages, Accessed on Jan. 21, 2015.

Once Through Cooling, http://www.healthebay.org/about-bay/current-policy-issues/keeping-animals-healthy/open-ocean-intakes, 2 pages, Accessed on Jan. 16, 2015.

Cooling Power Plants, http://www.world-nuclear.org/info/current-and-future-generation/cooling-power-plants/, 14 pages, Accessed on Jan. 16, 2015.

Power Plants Using Once Through Cooling, http://www.cacoastkeeper.org/programs/healthy-marine-habitats/power-plants-otc, 5 pages, Accessed on Jan. 16, 2015.

Elimelech et al., The future of seawater desalination: energy, technology, and the environment, Science (2011), 333 (6043):712-717.

* cited by examiner

WATER COOLED FACILITIES AND ASSOCIATED METHODS

CROSS-REFERENCE TO RELATED APPLICATIONS

Pursuant to 35 U.S.C. § 119(e), this application claims priority to the filing date of the U.S. Provisional Patent Application Ser. No. 62/051,220 filed Sep. 16, 2014; the disclosure of which application is herein incorporated by reference.

INTRODUCTION

A growing number of facilities in the United States produce heat and as such, employ cooling systems to function effectively. In recent years, electrical power consumption in the United States has risen significantly. It is estimated that in 2012 alone 3,741 billion kWh of electricity was consumed in the United States. Accordingly, a range of infrastructure solutions for effectively generating and delivering electrical power have been developed and implemented.

For example, many consumers, including companies, depend on electrical energy supplied by one or more power plants via an electrical grid. Such power plants generate electricity using components which produce a large amount of heat. As such, power plants often have extensive cooling systems designed to cool electricity-producing components so that the components can function properly.

Another growing trend in the United States is the increasing volume of internet traffic. It is estimated that in the United States, internet traffic increased from 40,000-70,000 terabytes/month in 2001 to 3,400,000-4,100,000 terabytes/month in 2011. To support the steep growth in internet traffic, a large amount of computer-related infrastructure has been developed and implemented. One type of infrastructure that has been increasingly utilized is data centers.

Data centers are facilities that house computer systems and associated components for operation therein. Data centers may include computers, data storage devices, servers, telecommunications systems or other related equipment and may be used to manage, store, process and/or exchange digital information and data. The operation of electrical components within data centers for these functions produces a large amount of heat. As such, many data centers have intricate cooling systems designed to cool electrical components so that the components can operate effectively.

SUMMARY

The present disclosure provides facilities having water cooling subsystems and multi-lumen conduits coupled thereto. Also provided are methods of cooling facilities by, for example, receiving cool water into a water cooling subsystem of a facility and outputting warm water from the water cooling subsystem.

The subject disclosure provides facilities and methods of cooling the facilities. Such facilities may include a water cooling subsystem and a multi-lumen conduit fluidically coupling the water cooling subsystem and a cool water source, such as an ocean or sea. In some embodiments of the subject disclosure, the facility is a power plant, data center, and/or desalination plant and the water cooling subsystem is configured to cool the facility. In some versions of the disclosed subject matter, a facility includes a server farm and the water cooling subsystem is configured to cool the server farm. In some embodiments, the methods of cooling facilities include receiving cool water into a water cooling subsystem of a facility via a multi-lumen conduit fluidically coupling the water cooling subsystem and a cool water source, and/or outputting warm water from the water cooling subsystem.

In various aspects, the subject facilities and associated methods include a multi-lumen conduit, e.g., a multi-lumen conduit configured for simultaneous bi-directional fluid flow, including an intake lumen and a discharge lumen therein. In some embodiments, a water cooling subsystem is configured to receive cool water from the intake lumen and output warm water. Discharge lumens of the subject facilities may also be configured to discharge a produced fluid, e.g., brine. Such a produced fluid may be received into a discharge lumen from a separate facility, e.g., a water desalination plant configured to receive and desalinate water. Additionally, where desired, the disclosed facilities and associated methods include water desalination plants, e.g., reverse osmosis desalination plants, configured to receive warm water from a water cooling subsystem. Also, in some embodiments, the methods include desalinating water with a water desalination plant.

In some embodiments of the subject facilities having a multi-lumen conduit, the intake lumen comprises an intake terminus and the discharge lumen comprises a discharge terminus at a different location than the intake terminus. Where desired, the intake terminus and/or discharge terminus is positioned at a depth of 15 m or more in a water source. Also, in some variations, the intake terminus and/or discharge terminus is positioned below the photic zone in a water source.

Versions of the subject facilities and associated methods include multi-lumen conduits having an intake lumen which is adjacent to and/or substantially co-axial with a discharge lumen. In some aspects of multi-lumen conduits, the conduits have an intake lumen which is positioned at least partially within a discharge lumen. In some embodiments, a discharge lumen is positioned at least partially within an intake lumen.

These and other objects, advantages, and features of the disclosed subject matter will become apparent to those persons skilled in the art upon reading the details of the systems, devices and methods as more fully described below.

DETAILED DESCRIPTION

Figure 1:
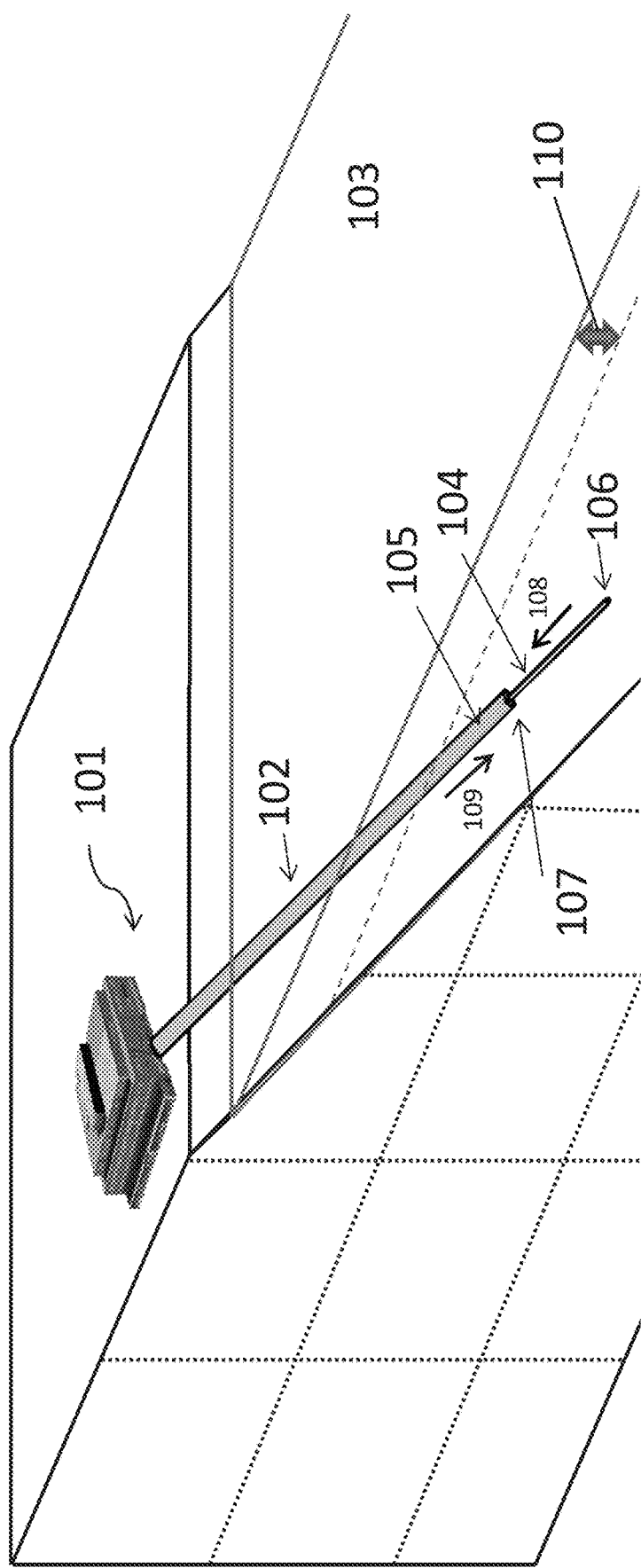
FIG. 1 provides a diagram of one embodiment of a disclosed facility including a multi-lumen conduit having a portion positioned in a water source.

The present disclosure provides facilities having water cooling subsystems and multi-lumen conduits coupled thereto. Also provided are methods of cooling facilities by, for example, receiving cool water into a water cooling subsystem of a facility and outputting warm water from the water cooling subsystem.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, some potential and exemplary methods and materials may now be described. Any and all publications mentioned herein are incorporated herein by reference to disclose and describe the methods and/or materials in connection with which the publications are cited. It is understood that the present disclosure supersedes any disclosure of an incorporated publication to the extent there is a contradiction.

It must be noted that as used herein and in the appended claims, the singular forms "a", "an", and "the" include plural referents unless the context clearly dictates otherwise. Thus, for example, reference to "an intake" includes a plurality of such intakes and reference to "the material" includes reference to one or more materials and equivalents thereof known to those skilled in the art, and so forth.

It is also noted that definitions provided in one section of this application (e.g., the "Systems" section) may also apply to embodiments described in another section of the application (e.g., the "Methods" section) even if a term is described as applying to an embodiment of a particular section.

It is further noted that the claims may be drafted to exclude any element which may be optional. As such, this statement is intended to serve as antecedent basis for use of such exclusive terminology as "solely", "only" and the like in connection with the recitation of claim elements, or the use of a "negative" limitation.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. To the extent such publications may set out definitions of a term that conflict with the explicit or implicit definition of the present disclosure, the definition of the present disclosure controls.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Facilities

Facilities and various components for cooling facilities are provided by the subject disclosure. The facilities may, for example, include one or more water cooling subsystems and one or more multi-lumen conduits, such as a multi-lumen conduit operatively, e.g., fluidically, coupling the water cooling subsystem and a cool water source.

The terms "facility" and "facilities", as used herein and described in further detail below, refer to one or more units including space and/or equipment necessary for performing an action therein. For example, a facility may be one or more buildings configured for physically housing (i.e., containing within it) one or more aspects, e.g., a water cooling subsystem, therein. In some versions, the subject facilities include one or more industrial and/or commercial and/or residential facilities. Embodiments of the subject facilities include one or more of desalination plants, data centers, and/or power plants.

As used herein, the terms "power plant" and "power station", refer to a facility for the generation of electric power. In particular aspects, power plants house components for generating and transmitting electric power.

The term "data center", as used herein and described in further detail below, refers to a facility configured and/or used for physically housing (i.e., containing within it) one or more computer systems and/or associated components. In certain embodiments, data centers include the components therein and manage, store, process and/or exchange digital information and data. For example, in some aspects, data centers include, e.g., contain therein, one or more server farms. By "server farm" is meant a collection of computer servers configured to accomplish server performance beyond the capability of a single computer.

In addition, as used herein and described in further detail below, the terms "desalination plant" and "water desalination plant" refer to a facility configured and/or used for desalinating water. In some embodiments, desalination plants house components for desalinating water.

The terms "desalinate" and "desalination", as used herein, refer to any of several processes to remove an amount of salt and/or other minerals or components from saline water (i.e., water that contains a concentration of at least one dissolved salt). In some embodiments of the disclosed systems, desalination is removing an amount of salt and/or other minerals or components from saline water so that the water is fit for consumption by a living organism (i.e., a living organism may consume the water and thereby maintain a healthy hydration level and/or a living organism may consume the water without the water having a detrimental effect on the organism's health). In some embodiments of the disclosed systems, desalination makes water potable. In certain embodiments the living organism is a "mammal" or "mammalian", where these terms are used broadly to describe organisms which are within the class mammalia, including the orders carnivore (e.g., dogs and cats), rodentia (e.g., mice, guinea pigs, and rats), and primates (e.g., humans, chimpanzees, and monkeys). In some embodiments, the living organism is a human. The term "human" may include human subjects of both genders and at any stage of development (e.g., fetal, neonates, infant, juvenile, adolescent, adult), where in certain embodiments the human subject is a juvenile, adolescent or adult. In some embodiments of the disclosed systems, desalination is removing an amount of salt and/or other minerals or components from saline water so that the water is fit for a specific purpose (e.g., irrigation).

In some embodiments of the subject disclosure, a plurality of facilities, e.g., a power plant, data center, and/or desalination plant, or any combination thereof, are co-located with one another. The terms "co-locate", "co-located" and "co-locating", as used herein refer to placing two or more entities (e.g., facilities) in proximity (i.e., within a certain distance). In some aspects of the disclosed systems, co-located entities may be located such that they share one or more common aspects (e.g., components such as specific systems or machinery). In some aspects, co-located entities may be located, for example, within 0.1 m; 1 m; 10 m; 100 m; 1,000 m; 10,000 m; or 100,000 m of one another. In various embodiments, co-located entities may have a distance between them of 0.1 m or less; 1 m or less; 10 m or less; 100 m or less; 1,000 m or less; 10,000 m or less; or 100,000 m or less. In certain embodiments, co-located entities are two or more facilities located on immediately adjacent or abutting areas or parcels of land. In certain embodiments, co-located entities are two or more facilities located on the same area of land. In some versions of the disclosed systems, co-located entities may be located such that they are in fluid communication (e.g., the units are configured such that at least one fluid may move and/or flow between the units). In certain variations of the disclosed systems, co-located entities are located such that they share one or more of the components described herein (e.g., a water cooling subsystem). In certain embodiments of the disclosed systems, co-located entities may be located such that they are electrically connected (e.g., connected by at least one conductive material) and/or share at least one electrical component. In particular instances, co-located entities are located such that their location allows them to be more energy-efficient (e.g., use less energy, e.g., electrical power, for the same amount of productivity) than the entities would be if they were located in a different position (e.g., a greater distance away from each other). In various embodiments, co-located entities are located such that their location allows them to produce fewer carbon emissions (e.g., carbon dioxide emissions) or have a smaller carbon footprint than the entities would if they were located in a different position (e.g., a greater distance away from each other). In some versions, co-located entities are located such that their location allows them to minimize potential pollutants (e.g., thermal pollution) emitted therefrom. In certain embodiments of the disclosed systems, co-located entities, e.g., facilities, are located in a manner wherein they are operably, e.g., fluidically, connected.

By "operably connected" and "operably coupled", as used herein, is meant connected in a specific way (e.g., in a manner allowing water to move and/or electric power to be transmitted) that allows the disclosed system and its various components to operate effectively in the manner described herein. For example, a power plant operably connected to a data center may allow electricity to flow (e.g., be transmitted along at least one conductive material) between the power plant and the data center such that the energy required to operate the data center would be at least partially obtained from the power plant.

In addition, in some embodiments of the subject disclosure, one element, e.g., a multi-lumen conduit of a facility, operably couples e.g., fluidically couples, two other elements, e.g., a water cooling subsystem and a cool water source. By "fluidically connected", and "fluidically coupled", as used herein, is meant two or more entities, e.g., facilities and/or components thereof, operably connected in a matter allowing a fluid, e.g., water, to move between the two or more entities. As such, the term "fluidically coupling" refers to providing a fluidic connection between two or more entities, e.g., facilities and/or components thereof, such that a fluid, e.g. water may move between the two entities.

FIG. 1 provides a diagram of one embodiment of a disclosed facility 101. The facility 101 includes a multi-lumen conduit 102 having a portion positioned below the photic zone 110 in a water source 103. The multi lumen conduit 102 includes an intake lumen 104 and a discharge lumen 105. It is noted that the intake lumen 104 as shown can alternatively be a discharge lumen and the discharge lumen 105 as shown can alternatively be an intake lumen. Also shown in FIG. 1 is an intake terminus 106 of intake lumen 104 and a discharge terminus 107 of discharge lumen 105. It is also noted that the intake terminus 106 as shown can alternatively be a discharge terminus and the discharge terminus 107 shown can alternatively be an intake terminus. A possible direction 108 of water movement in the intake lumen 104 and a possible direction 109 of water movement in the discharge lumen 105 are also illustrated.

Figure 2:
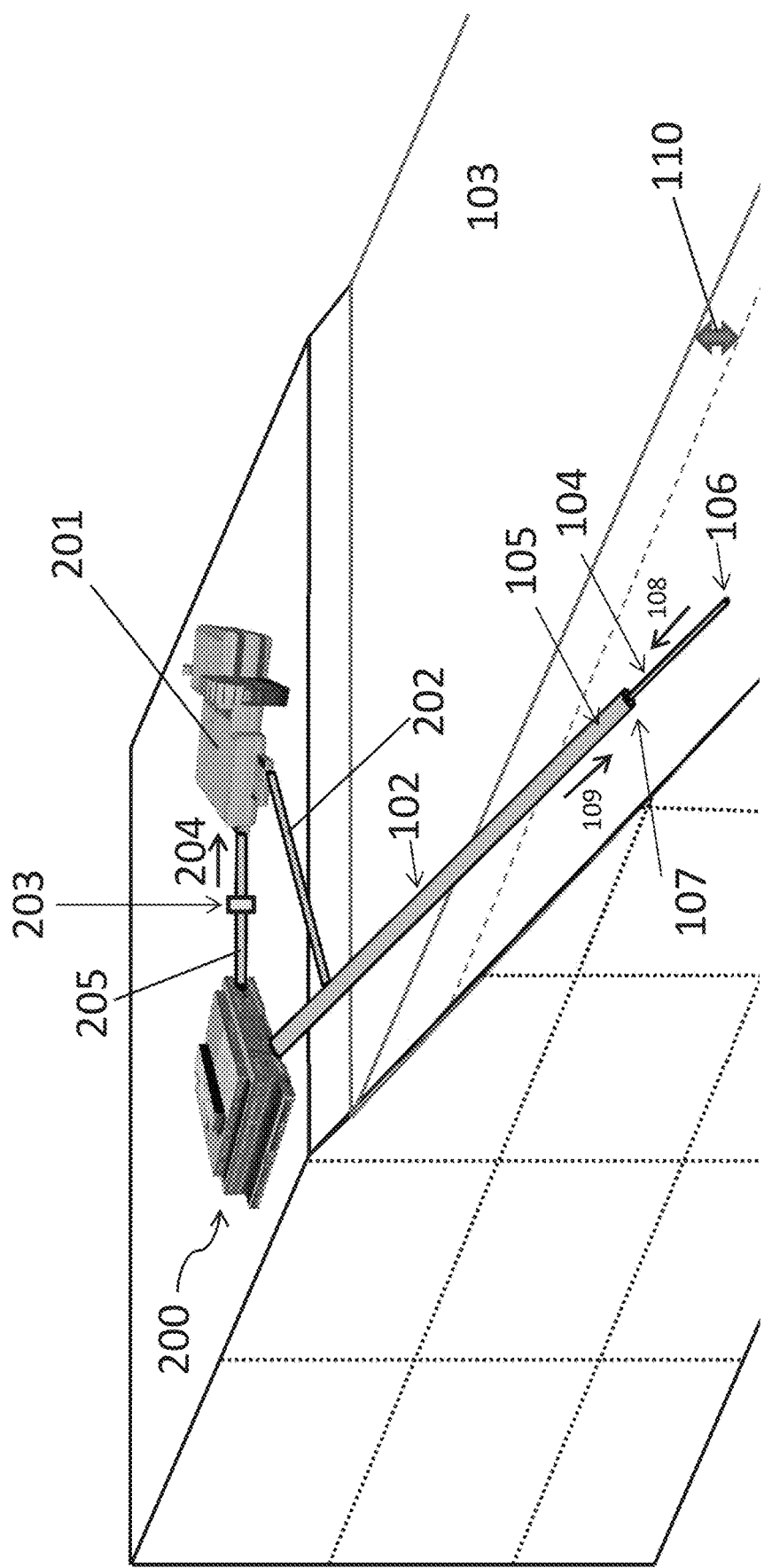
FIG. 2 provides a diagram of one embodiment of a disclosed first facility and second facility operably coupled to the first facility.

In certain instances, and as depicted by the diagram of FIG. 2, a subject first facility 200, such as a data center and/or power plant, may include many of the same components and aspects illustrated in FIG. 1, including a multi-lumen conduit 102 having a portion positioned below the photic zone 110 in a water source 103. The multi lumen conduit 102 includes an intake lumen 104 and a discharge lumen 105. Also shown is an intake terminus 106 of intake lumen 104 and a discharge terminus 107 of discharge lumen 105. Also depicted in FIG. 2 is a second facility 201 which, in some embodiments, is a desalination plant. FIG. 2 also illustrates an operable connection 205 and a coupling component 203 between the first facility 200 and the second facility 201. A possible direction 204 of water movement in the operable connection 205 is also provided. Furthermore, FIG. 2 illustrates a water discharge 202, which may be an operable connection between, for example, a second facility 201 and a multi-lumen conduit 102 and/or the discharge lumen 105 thereof.

Figure 3:
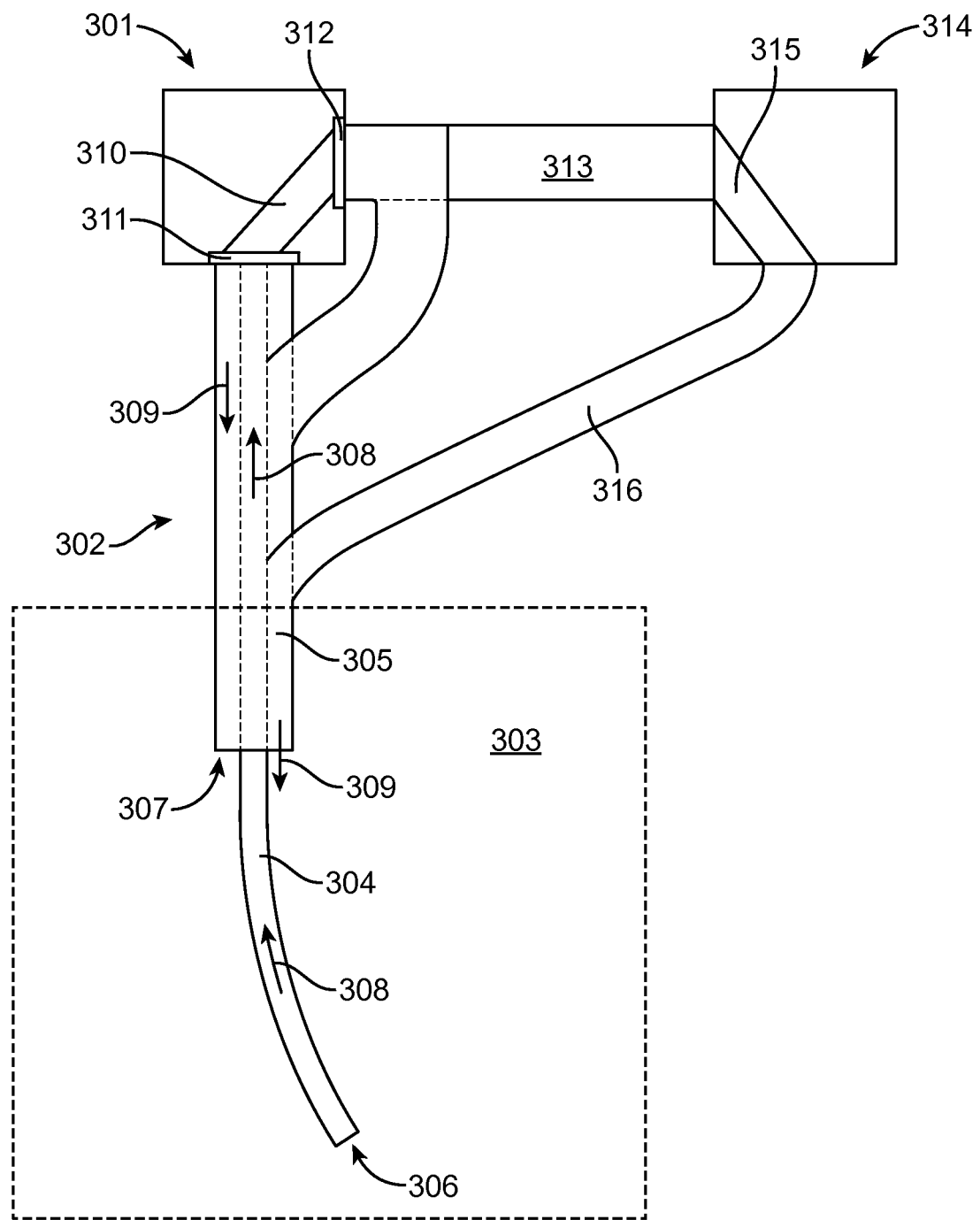
FIG. 3 provides a schematic diagram of one embodiment of a first facility including a water cooling subsystem and a multi-lumen conduit as well as an optional second facility.

FIG. 3 depicts a schematic diagram of a first facility 301 including a water cooling subsystem 310 and a multi-lumen conduit 302. The water cooling subsystem includes a receiver 311 and a warm-water emitter 213. The multi-lumen conduit 302 is positioned, at least in part, in a water source 303. The multi-lumen conduit 302 also includes an intake lumen 304 and a discharge lumen 305. Also shown is an intake terminus 306 of intake lumen 304 and a discharge terminus 307 of discharge lumen 305. It is noted that the intake lumen 304 as shown can alternatively be a discharge lumen and the discharge lumen 305 as shown can, in a different embodiment, alternatively be an intake lumen. Furthermore, the intake terminus 306 as shown can alternatively be a discharge terminus and the discharge terminus 307 shown can alternatively be an intake terminus. A possible direction 308 of water movement in the intake lumen 304 and a possible direction 309 of water movement in the discharge lumen 305 are also shown.

The first facility 301, e.g., a power plant and/or data center, as shown in FIG. 3 may also optionally be connected to a second facility 314, e.g., a desalination plant, via an operable connection 313. The second facility 314 may include an interconnected desalination structure 315. Element 315 may, in other embodiments, also be a water cooling subsystem of the second facility 314. Furthermore, FIG. 3 provides a water discharge 316. As shown, water discharge 316 operably connects the interconnected desalination structure 315 and the discharge lumen 305 of the multi-lumen conduit 302.

Figure 4:
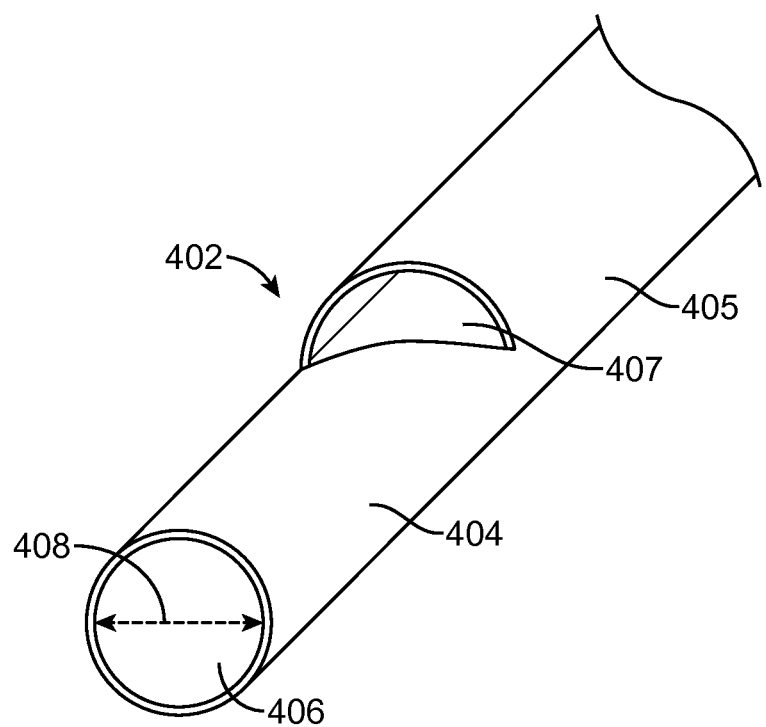
FIG. 4 provides a diagram of one embodiment of a portion of a multi-lumen conduit having an intake lumen and a discharge lumen which are adjacent to one another.

One embodiment of a portion of a multi-lumen conduit 402 is shown in FIG. 4. FIG. 4 provides an intake lumen 404 and a discharge lumen 405 which are adjacent to one another in the multi-lumen conduit 402. Also shown is an intake terminus 406 of intake lumen 404 and a discharge terminus 407 of discharge lumen 405. It is noted however that the intake lumen 404 as shown can alternatively be a discharge lumen and the discharge lumen 405 as shown can alternatively be an intake lumen. Furthermore, discharge terminus 407 can alternatively be an intake terminus and intake terminus 406 can alternatively be a discharge terminus. Also provided in FIG. 4 is a cross-sectional diameter 408 of the intake terminus 406.

Figure 5:
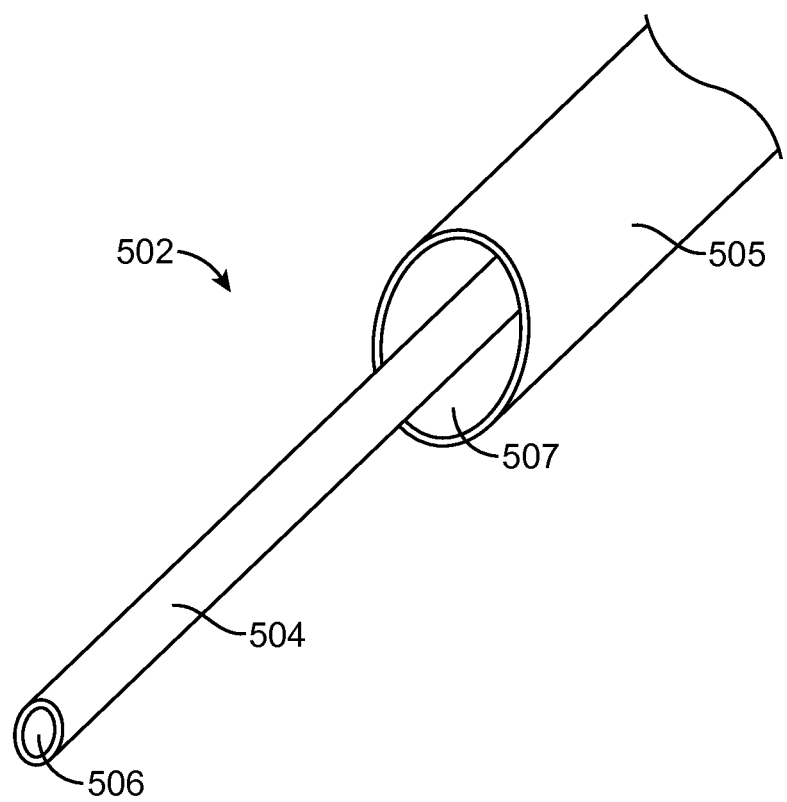
FIG. 5 provides a diagram of one embodiment of a portion of a multi-lumen conduit having an intake lumen and a discharge lumen which are co-axial with one another.

FIG. 5 provides an embodiment of a portion of a multi-lumen conduit 502 including an intake lumen 504 and a discharge lumen 505 which are co-axial. Also shown is an intake terminus 506 of intake lumen 504 and a discharge terminus 507 of discharge lumen 505. It is noted however that the intake lumen 504 as shown can alternatively be a discharge lumen and the discharge lumen 505 as shown can alternatively be an intake lumen. Furthermore, discharge terminus 507 can alternatively be an intake terminus and intake terminus 506 can alternatively be a discharge terminus.

Various aspects of the embodiments of the systems shall now be described in greater detail below.

Water Cooling Subsystem

The subject disclosure provides one or more facilities, such as one or more industrial and/or commercial and/or residential facilities. As noted above, embodiments of the subject facilities include one or more desalination plants, data centers, and/or power plants. Due to the function of the subject facilities and/or components thereof, the facilities, in various embodiments, produce heat. Accordingly, facilities of the present disclosure include one or more water cooling subsystems, such as a water cooling subsystem configured to cool a facility.

The phrases "water cooling subsystem" and "water cooling subsystems", as used herein, refer to an interconnected structure located, for example, at least partially within a facility, e.g., a power plant and/or data center, that is configured to cool a facility or at least one component (e.g., an engine) or portion (e.g., a room) of a facility, e.g., a power plant and/or data center. Where desired, the interconnected structure of a water cooling subsystem includes one or more components (e.g., conduits, such as pipes and/or containers) configured to carry water from one location (e.g., the location of an intake lumen of a multi-lumen conduit) to another location. In certain embodiments, water cooling subsystems include a receiver, such as a conduit, configured for receiving water into the water cooling subsystem. In various embodiments, one or more receivers are operatively coupled to a multi-lumen conduit, as described herein, or a portion thereof, such as an intake lumen and/or a discharge lumen.

In some aspects, receivers are configured for receiving water, e.g., cool water, into the water cooling subsystem from a multi-lumen conduit, or a portion thereof, such as an intake lumen. In certain embodiments, water cooling subsystems include a warm water emitter, such as a conduit. In some embodiments of warm water emitters, the emitters are operably coupled to a separate facility, e.g., a desalination plant, and/or include one or more container and/or conduit configured, for example, to convey fluid, e.g., warm water, out of a facility. In some embodiments, water cooling subsystems are water-tight except for a receiver for receiving water into the subsystems and warm water emitter for discharging water out of the subsystems. The water cooling subsystem, in some instances, may be operably coupled, e.g., fluidically coupled, to a water (e.g., cool water) source, such as an ocean and/or sea and/or river and/or lake and/or groundwater source and/or other water source by, for example, a multi-lumen conduit. In some versions, a water cooling subsystem may be configured to receive or withdraw water (e.g., cool water) from an ocean and/or sea and/or river and/or lake and/or groundwater source and/or other water source via, for example, a multi-lumen conduit.

In some instances, water cooling subsystems of facilities are configured to cool one or more facilities using cool water (e.g., seawater). In some versions, water cooling subsystems are configured to cool one or more elements of facilities, such as one or more engines. In certain embodiments, water cooling subsystems include an interconnected structure of pipes and/or containers and/or pumps (e.g., pumps as described below) configured for moving water through (e.g., in to and/or out of) the interconnected structure and thereby cooling a facility. In certain versions, facilities produce and output a produced fluid, e.g., warm water. In certain aspects, water cooling subsystems are operably connected to one or more discharge lumen, as described herein, and/or other water discharge element, and may be configured to output water into the one or more discharge lumen and/or to a separate facility, e.g., a water desalination plant.

In certain versions of water cooling subsystems, the subsystems include and/or operatively coupled with environmental control systems (e.g., one or more air conditioning units) for controlling at least a portion of the environment with a facility. In some aspects, environmental control systems include temperature control systems that are configured to heat and/or cool at least a portion of one or more of the subject facilities. In some instances, environmental control systems include humidity control systems that are configured to control the amount of humidity in at least a portion of the subject facilities. In some aspects, environmental control systems include pressure control systems that are configured to control the pressure level in at least a portion of the subject facilities.

The term "water", as used herein, refers to the chemical compound having the chemical formula $H_2O$. Water may also be salt water (e.g., seawater) and as such may include one or more substances (e.g., salts) dissolved therein. Salt water (e.g., seawater) may have a salinity of about 3.5% (35 g/L, or 599 mM) (e.g., a salinity of 3.4% to 3.6% or 3.1% to 3.8%). Water may also be in the form of a liquid and/or gas.

Water, as described in the application, may also have a variety of different temperatures. By "cool" water, as used herein, is meant water that has a lower temperature than "warm" water, as described herein. In some aspects the temperature of cool water is within the range 1° C. to 35° C., wherein the range includes 1° C. and 35° C. For example, in some instances the temperature of cool water is within one of the following inclusive ranges: 5° C. to 30° C., 10° C. to 25° C. or 15° C. to 20° C. In particular aspects, the temperature difference between cool water and warm water may range from 1° C. to 99° C. For example, the temperature difference between cool water and warm water may be 1° C. or less; 10° C. or less, 20° C. or less, 50° C. or less, or 90° C. or less. The temperature difference between cool water and warm water may also be, for example, 1° C. or more; 2° C. or more; 3° C. or more; 4° C. or more; 5° C. or more; 10° C. or more; 15° C. or more; 20° C. or more; 25° C. or more; 30° C. or more; 35° C. or more; 40° C. or more; or 50° C. or more. In some aspects, cool water may have a temperature within one of the above listed ranges when the cool water enters and/or exits a component of the systems described herein (e.g., an intake lumen). In some aspects, cool water may have the same temperature as the water source from which the cool water is taken. For example, cool water may have the same temperature as that of the portion of ocean or sea surrounding (e.g., a location at or within a distance of 1 m and/or 10 m and/or 100 m and/or 1000 m) one or more elements of the system disclosed herein (e.g., an intake lumen and/or a warm water emitter and/or a discharge lumen). In certain aspects of the disclosed systems, the cool water is received into the systems from a cool water source such as an ocean or sea. A cool water source may be operably connected, e.g., fluidically connected, to a water cooling subsystem such that water may flow, for example, from the cool water source into the water cooling subsystem. In some aspects, a cool water source may be operably connected, e.g., fluidically connected, to a water cooling subsystem by a multi-lumen conduit, as described herein. In some instances, the temperature of cool water increases and/or decreases as the water progresses through the disclosed facilities and/or systems.

By "warm" water, as used herein, is meant water that has a higher temperature than "cool" water, as described herein. In some aspects the temperature of warm water is within the inclusive range 36° C. to 100° C. For example, in some instances the temperature of warm water is within one of the following inclusive ranges: 36° C. to 90° C.; 45° C. to 75° C.; or 55° C. to 65° C. As noted above, in particular instances, the temperature difference between cool water and warm water may range from 1° C. to 99° C. For example, the temperature difference between cool water and warm water may be, 1° C. or less; 2° C. or less; 3° C. or less; 4° C. or less; 5° C. or less; 10° C. or less; 15° C. or less; 20° C. or less; 25° C. or less; 30° C. or less; 35° C. or less; 40° C. or less; or 50° C. or less. In some aspects, warm water may have a temperature within one of the above listed ranges when the warm water enters and/or exits a component of the systems described herein (e.g., a discharge lumen). In some aspects, warm water may have a higher temperature than the cool water source from which the cool water is taken. For example, warm water may have a higher temperature than that of the portion of ocean or sea surrounding (e.g., a location at or within a distance of 1 m and/or 10 m and/or 100 m and/or 1000 m) one or more elements of the system disclosed herein (e.g., an intake lumen and/or a discharge lumen). In some embodiments, the temperature of warm water increases and/or decreases as the water progresses through the disclosed systems.

In some aspects, a water cooling subsystem may be configured to carry cool water to at least one location in a facility (e.g., a location where heat is produced by the facility) where the cool water is heated and thereby converted to warm water. Cool water may be heated and converted to warm water within a heat exchange element of a water cooling subsystem, which is described in further detail herein. The water cooling subsystem may also, in some instances, be configured to carry warm water away from one location in a facility (e.g., the location of a heat exchange element) to another location (e.g., a location outside a portion of a facility, such as a power plant, which contains one or more engines, such as combustion engines, and/or associated components). Where desired, a water cooling subsystem is configured to carry heat energy away from one or more engine and/or associated components that generate heat energy by allowing generated heat energy to be transferred to water (e.g. cool water) within the water cooling subsystem (e.g., within a heat exchange element of the water cooling subsystem) and thereafter, transferring the heated water (e.g., warm water) away from the position within the facility where it was heated. By transferring water within a facility and thereby cooling one or more engines and/or associated components within the facility, the water cooling subsystem optimizes the operation of the systems and/or components by providing an environment in which the systems and/or components may effectively operate.

In certain instances, water cooling subsystems include a heat exchange element. In particular embodiments, heat exchange elements are configured to cool one or more locations and/or components within a facility. For example, heat exchange elements may be configured to allow an exchange of heat produced by a facility at a first location to a medium (e.g., air and/or water) and thereafter transfer the heated medium to a second location so that the first location of the facility and/or components at the first location are cooled. In some aspects, heat exchange elements are configured such that a medium (e.g., cool water) may be channeled into the heat exchange element (e.g., from a first portion of the water cooling subsystem) and/or a medium (e.g., warm water) may be channeled out of the heat exchange element (e.g., to a second portion of the water cooling subsystem).

In certain aspects, a heat exchange element is an air conditioning system (e.g., one or more air conditioning units). In some instances, heat exchange elements are configured to cool air around (e.g., in the same room of a facility as facility components) components (e.g., mechanical and/or electrical components) of the facility which produce heat. In some instances, heat exchange elements are configured to allow the transfer of heat from air (e.g., air heated by facility components) around (e.g., in the same room of a facility as facility components) components (e.g., mechanical and/or electrical components) of the facility which produce heat to cool water. Such an exchange will result in the air being cooled and the water being warmed (e.g., to warm water). Accordingly, in some aspects, cool water is heated to warm water within the heat exchange element. In certain instances, heat exchange elements are configured to remove air that has been heated by components of a facility from the area of the facility (e.g., room) in which the components are located.

In certain embodiments, heat exchange elements are one or more channels (e.g., channels having a large interior and/or exterior surface area) physically integrated with components of a facility (e.g., mechanical and/or electronic components which produce heat). Where desired, heat exchange elements are configured such that water may flow through them and thereby transfer heat away from the facility components. In some versions, the heat exchange element is operably connected to the remainder of the water cooling subsystem at one or more locations (e.g., one, two, three, four or five locations). In certain aspects, the heat exchange element is composed of the same materials as the remainder of the water cooling subsystem or different materials. Examples of heat exchange elements or components thereof that may be utilized either wholly or partially in connection with the disclosed systems are provided by U.S. Pat. Nos. 6,062,304; 4,896,830; 3,242,914; 5,746,270; 6,667,122; 6,478,078; 6,877,338; 5,599,217; 5,257,661; 5,427,062; 5,226,594; 7,537,851; 8,034,501; 6,852,435; 6,673,482; 6,374,627; 8,009,430; 7,525,207; 7,347,058; 8,004,832; 7,810,341; 7,808,780; 6,574,104; 6,859,366; 8,157,626; 7,881,057; 6,980,433; 6,945,058; 6,854,284; 6,834,512; 6,775,997; 6,772,604; 8,113,010; 8,276,397; U.S. Patent Application No. U.S. 20100263854; U.S. Patent Application No. US 20130022432; U.S. Patent Application No. US 20050179261; U.S. Patent Application No. US 20070114005; U.S. Patent Application No. US 20070277960; U.S. Patent Application No. US 20130031895; U.S. Patent Application No. US 20030056737; U.S. Patent Application No. U.S. 20130236804; U.S. Patent Application No. U.S. 20030203258; U.S. Patent Application No. US 20120235419; U.S. patent application Ser. Nos. 12/531,215; 13/372,100; 12/844,658; 12/873,909; 12/264,648; and 12/332,708, the disclosures of each which are incorporated by reference herein.

As noted above, in certain embodiments, water cooling subsystems include a warm water emitter. In various instances, warm water emitters are operably connected (e.g., attached in a water-tight manner) to one or more other facility, e.g., desalination plants and/or power plant and/or data center. In some versions, warm water emitters are part of the same structure as the coupling components described herein. Where desired, warm water emitters expel warm water out of a water cooling subsystem and/or into a cool water source or body of water. In some embodiments, warm water emitters include one or more openings through which warm water may move (e.g., flow). In certain embodiments, a warm water emitter is a pipe and may be made of the same and/or different materials and/or types of materials as the intake lumens described herein. In certain versions, a warm water emitter is positioned inside or outside a portion of a facility which contains one or more engines, computers and/or associated components.

Embodiments of water cooling subsystems, and in certain versions, multi-lumen conduits, include one or more filters configured for purifying water. In certain instances, at least one filter is located at one or more openings in a multi-lumen conduit and/or water cooling subsystem and/or at an end of a water cooling subsystem furthest from the portion of a facility housing components which produce heat. Where desired, a filter is positioned within a portion of a facility housing components which produce heat, e.g., components for generating power and/or related equipment.

Water cooling subsystems may, in various embodiments, be composed of one or more materials or one or more types of materials. Examples of materials that the water cooling subsystems of the disclosed facilities may be composed of include polymers, ceramics, metals, glasses and/or a combination thereof. In some instances, the water cooling subsystems are not composed of metal or material that is subject to corrosion (e.g., corrosion by rust). In some embodiments, water cooling subsystems are composed of plumbing materials. For example, water cooling subsystems may be composed of polyvinyl chloride (PVC) pipes and/or joints and one or more adhesives for fastening the pipes in a water-tight manner. Where appropriate, one or more materials of the water cooling subsystems may be rigid. In some aspects, one or more materials of the water cooling subsystems may be flexible (e.g., one or more rubber tubes or hoses). However, these examples of materials are not limiting and the materials of the water cooling subsystems may be any material, or combination of materials, having the structural and chemical properties necessary to function in the disclosed systems as described herein.

A water cooling subsystem, in various instances, includes a pump. In some embodiments, a pump is a means for causing water to move through water cooling subsystems and/or other components (e.g., intake lumens; discharge lumens and/or desalination plants), as described herein. In certain variations, a pump causes water to move unidirectionally or bidirectionally through water cooling subsystems and/or other components, as described herein. In some instances, a pump is electrically powered and/or fossil fuel powered and/or powered by another means. In certain aspects, a pump is operably connected to a power source (e.g., a power plant), as described herein. In particular versions, waves, tides, and/or a pump powered by tides, cause water to move through the water cooling subsystems and/or other components (e.g., desalination plants) described herein. In some embodiments, one or more pumps are located within facilities, e.g., power plants and/or desalination plants, as described herein. In certain embodiments, one or more pumps are located outside facilities, e.g., power plant and/or desalination plants, as described herein.

In particular aspects, water cooling subsystems include one or more valves within the subsystems for controlling the movement of water through the subject facilities. In some embodiments, the valves are controllable (e.g., configured to be opened and/or closed in response to a designated signal or action). Where desired, each valve is individually controllable (e.g., a valve may be opened and or closed while other valves are not). In certain embodiments, the one or more valves include electrical components and may be configured to receive an electronic signal from a controller operably connected thereto.

Multi-Lumen Conduit

The subject disclosure provides one or more facilities including one or more multi-lumen conduits. The phrase "multi-lumen conduit", as used herein, refers to a structure, e.g., one or more tubes, sized and/or shaped for conveying and/or maintaining one or more substance, e.g., water, e.g., cool and/or warm water and/or brine, and having a plurality of lumens therein. In various embodiments, multi-lumen conduits include a conduit, e.g., a tube and/or a pipe, which includes a plurality, e.g., two or more, three or more, five or more, or ten or more, lumens therein through which one or more substances, e.g., water, may pass. In some instances the multi-lumen conduits are dual lumen conduits, in that they include a first and second lumen, which first and second lumens may be configured in a variety of different ways, e.g., as described in greater detail below. In some aspects, multi-lumen conduits couple a water cooling subsystem, as described above, and a cool water source. Where desired, multi-lumen conduits include one or more components (e.g., conduits, such as pipes and/or containers) configured to carry water from one location (e.g., the location of an intake lumen terminus of a multi-lumen conduit) to another location (e.g., a receiver of a water cooling subsystem).

In some embodiments, multi-lumen conduits include one or more intake lumens and/or one or more discharge lumens. Where desired, intake lumens include one or more conduit, e.g., a tube and/or a pipe, and/or are configured for receiving water, e.g., cool water, into a multi-lumen conduit. In some instances, discharge lumens include one or more conduits, e.g., a tube and/or a pipe, and are configured for expelling water, e.g., warm water, from a multi-lumen conduit. In some embodiments of discharge lumens, the discharge lumens are operably coupled to a separate facility, e.g., a desalination plant, and/or include one or more container and/or pipe. In some embodiments, discharge lumens are configured, for example, to discharge fluid, e.g., a produced fluid, such as warm water and/or brine, out of a facility or a plurality of facilities, or a portion thereof, such as a multi-lumen conduit. Where desired, a produced fluid, e.g., brine, is received into the multi-lumen conduit or portion thereof, e.g., discharge lumen, from a facility, e.g., a water desalination plant configured to receive and desalinate water, or a portion thereof, e.g., a water discharge. In some aspects, discharge lumens are operably coupled to water cooling subsystems. In some versions, discharge lumens are operably coupled to water discharges, e.g., water discharges of facilities, such as water desalination plants. In some embodiments, multi-lumen conduits are water-tight except for the locations at which they are operatively coupled to a facility and/or at which they intake cool water and/or discharge a fluid, such as water and/or brine. In various aspects, an intake lumen is positioned fully and/or at least partially within a discharge lumen whereas in other aspects, a discharge lumen is positioned fully and/or at least partially within an intake lumen. In some embodiments, an intake lumen is positioned adjacent and/or parallel to a discharge lumen within a multi-lumen conduit. In some versions, intake lumens and discharge lumens are co-axial and/or substantially co-axial with one another. Furthermore, where desired, intake lumens and/or discharge lumens, or a portion thereof, e.g., an end portion, can be rigid or flexible.

Where desired, the multi-lumen conduits are configured for simultaneous bi-directional fluid flow. In other words, in some embodiments, fluids may simultaneously flow in different, e.g., opposite directions, within a multi-lumen conduit. In certain instances, one fluid, e.g., cool water, may flow toward a water cooling subsystem to which a multi-lumen conduit is coupled while another fluid, e.g., a produced fluid, flows away from the water cooling subsystem. In some versions of multi-lumen conduits, a first fluid, e.g., cool water, may flow from a first end, e.g., an end positioned within a cool water source, to a second end, e.g., an end operably coupled to a water cooling subsystem, of a multi-lumen conduit while a second fluid, e.g., a produced fluid, such as warm water, flows away from the first end, such as from the second end to the first end of the multi-lumen conduit.

A multi-lumen conduit, in some instances, is operably coupled, e.g., fluidically coupled, to a water (e.g., cool water) source, such as an ocean and/or sea and/or river and/or lake and/or groundwater source and/or other water source. In some versions, a multi-lumen conduit may be configured to receive or withdraw water (e.g., cool water) from an ocean and/or sea and/or river and/or lake and/or groundwater source and/or other water source. In various embodiments, the multi-lumen conduits and/or components thereof, e.g., intake lumens and/or discharge lumens, are composed of the same material or combination of materials which may make up the water cooling subsystems described herein.

In some embodiments, multi-lumen conduits include one or more intake lumen and/or discharge lumens having a first end, e.g., an end operably connected to a water cooling subsystem, and a second end, e.g., an end positioned in a water source. Each end of a multi-lumen conduit and/or aspects thereof, e.g., intake lumens and/or discharge lumens, may include one or more opening. In some embodiments, intake lumens include an intake terminus at an end of the intake lumen. By "intake terminus" is meant an end portion of an intake lumen, e.g., an end portion of an intake lumen positioned within a water source. In some embodiments, an intake terminus may include one or more openings of an intake lumen. In some embodiments, discharge lumens include a discharge terminus at an end of the discharge lumen. By "discharge terminus" is meant the end portion of a discharge lumen, e.g., an end portion of a discharge lumen positioned within a water source. In some embodiments, a discharge terminus may include one or more openings of a discharge lumen.

In some embodiments, multi-lumen conduits include an intake terminus of an intake lumen at a different location, e.g., a different location within a cool water source, than a discharge terminus of a discharge lumen. For example, an intake terminus may be spaced apart from a discharge terminus and may be separated by a distance of 0.1 m or more, 0.5 m or more, 1 m or more, 10 m or more, 20 m or more, 50 m or more, 100 m or more or 200 m or more. As such, in some embodiments, an intake lumen extends further than a discharge lumen at an end of a multi-lumen conduit, e.g., an end not operably coupled to a water cooling subsystem. In such an embodiment, an intake lumen includes a portion, e.g., a conduit, extending beyond an end of a discharge lumen or portion thereof, e.g., a discharge terminus, by a distance of, for example, 0.1 m or more, 0.5 m or more, 1 m or more, 10 m or more, 20 m or more, 50 m or more, 100 m or more or 200 m or more. Also, in some embodiments, a discharge lumen extends further than an intake lumen at an end of a multi-lumen conduit, e.g., an end not operably coupled to a water cooling subsystem. In such an embodiment, a discharge lumen includes a portion, e.g., a conduit, extending beyond an end of an intake lumen or portion thereof, e.g., an intake terminus, by a distance of, for example, 0.1 m or more, 0.5 m or more, 1 m or more, 10 m or more, 20 m or more, 50 m or more, 100 m or more or 200 m or more. In addition, in various aspects, multi-lumen conduits are configured to intake water, e.g., intake water via an intake lumen, at a different location, e.g., a location spaced apart by 0.1 m or more, 0.5 m or more, 1 m or more, 10 m or more, 20 m or more, 50 m or more, 100 m or more or 200 m or more, than the location at which the multi-lumen conduit discharges water, e.g., discharge water via a discharge lumen.

In some embodiments, multi-lumen conduits are configured to discharge water at a location more proximal to a water cooling subsystem to which a multi-lumen conduit is operably coupled than where the multi-lumen conduit intakes water. Also, where desired, multi-lumen conduits are configured to intake water at a location more proximal to a water cooling subsystem to which a multi-lumen conduit is operably coupled than where the multi-lumen conduit discharges water.

In some embodiments, multi-lumen conduits have a first end, e.g., a first end operably coupled to a water cooling subsystem, and a second end, e.g., an end positioned in a cool water source. Various aspects of multi-lumen conduits have a length, e.g., a length extending from a first to a second end, of 50 m or more; 100 m; 500 m or more; 1 km or more; or 2 km or more. In addition, multi-lumen conduits, and/or portions thereof, e.g., intake lumens and/or discharge lumens and/or intake termini and/or discharge termini, may have a diameter and/or cross-sectional width of 0.2 m or less; 0.5 m or less; 1 m or less; 1.5 m or less; 2 m or less; 3 m or less; or 5 m or less. Such a diameter and/or width may be a distance, e.g., a distance in a plane which is perpendicular to the longitudinal length of a conduit and/or lumen, from a central longitudinal axis of the multi-lumen conduit and/or lumen to its outermost point. A diameter can also be an average of such distances at a point along the conduit and/or lumen if the conduit and/or lumen is not round.

In some aspects, intake lumens include one or more openings (e.g., holes, gaps and/or slits) in the multi-lumen conduit configured to receive water (e.g., cool water) into the multi-lumen conduit. For example, intake lumens may include one or more pipes having one or more (e.g., one, two, three, four, five, six, seven, eight, nine, or ten or more) openings (e.g., an open end) positioned within a body of water such that water may flow into the one or more pipes. In some embodiments, an intake lumen or an opening therein is shaped as a circle, rectangle, square, slit, polygon, quadrilateral, oval, semi-circle, or other shape. In certain instances, an intake lumen or an opening therein may have a single defined radius of symmetry. In some versions, an intake lumen or an opening therein may have radii of curvature lying within a single plane (e.g., a vertical plane or a horizontal plane).

In various aspects, discharge lumens are configured for discharging a produced fluid, e.g., brine, from the disclosed facilities and/or components thereof, e.g., multi-lumen conduits. In some embodiments, discharge lumens are operably coupled to one or more facility, e.g., a desalination plant and/or a power plant, or components thereof, e.g., a water cooling subsystem, and/or a data center. Where appropriate, the discharge lumens include one or more openings (e.g., holes, gaps and/or slits) in the portions of the system configured for transporting a fluid, e.g., water and/or brine. For example, discharge lumens may be one or more pipes having at least one opening (e.g., an open end) positioned within a body of water such that a produced fluid, e.g., water and/or brine, may flow out of the one or more pipes. In some variations, discharge lumens or an opening therein is shaped as a circle, rectangle, square, slit, polygon, quadrilateral, oval, semi-circle, or other shape. In some embodiments, the shape, e.g., the cross-sectional shape, of an intake lumen and/or intake terminus is not the same as the shape, e.g., cross sectional shape of a discharge lumen and/or discharge terminus. Where desired, a discharge lumen or an opening therein may have a single defined radius of symmetry. In some aspects, a discharge lumen or an opening therein may have radii of curvature lying within a single plane (e.g., a vertical plane or a horizontal plane).

In certain embodiments, intake lumens are configured to intake or otherwise have an amount of fluid, e.g., water move through them in a set time period (e.g., a minute or hour or day). For example, water intakes may be configured to intake 5,000 L/day or less; 100,000 L/day or less; 1 million L/day or less; 500 million L/day or less; or 1 billion L/day or less. Intake lumens may also be configured to intake more than 1 billion L/day. Intake lumens, in particular embodiments, may be configured to intake an amount of water in any of the ranges: 5,000 L/day to 1 billion L/day; 5,000 L/day to 100 million L/day; 100,000 L/day to 1 million L/day; or 80 million L/day to 100 million L/day. In some aspects, intake lumens are configured such that the amount of water moving (e.g., flowing) through an intake lumen may be variable within a time period (e.g., one minute, one hour, one day, one month, one year).

In certain embodiments, discharge lumens are configured to discharge or otherwise have an amount of fluid, e.g., water and/or brine move through them in a set time period (e.g., a minute or hour or day). For example, discharge lumens may be configured to discharge 5,000 L/day or less; 100,000 L/day or less; 1 million L/day or less; 500 million L/day or less; or 1 billion L/day or less. Discharge lumens may also be configured to discharge more than 1 billion L/day. Discharge lumens, in particular embodiments, may be configured to discharge an amount of water in any of the ranges: 5,000 L/day to 1 billion L/day; 5,000 L/day to 100 million L/day; 100,000 L/day to 1 million L/day; or 80 million L/day to 100 million L/day. In some aspects, the amount of water moving (e.g., flowing) through a discharge lumen is variable within a time period (e.g., one minute, one hour, one day, one month, one year).

In particular aspects, an intake lumen or a portion thereof and/or a discharge lumen or a portion thereof is positioned outside a portion of a facility, e.g., a portion of a power plant containing one or more engines and/or associated components. Where desired, an intake lumen and/or a discharge lumen is in fluid communication with at least one portion of a water cooling subsystem located inside a portion of a facility, e.g., a portion of a power plant containing one or more engines and/or associated components, wherein cool water is heated (e.g., heated to warm water).

In various embodiments, an intake lumen, or a portion thereof, such as a terminal end or a portion thereof, e.g., an intake terminus, and/or a discharge lumen, or a portion thereof, such as a terminal end or a portion thereof, e.g., a discharge terminus, may be positioned at a depth of 15 m or more in a cool water source. Intake lumens and/or discharge lumens may also include one or more passages, such as one or more pipes, such as one or more pipes having an opening at each end. Some variations of the subject intake lumens and/or discharge lumens, or a portion thereof, e.g., an opening and/or an intake terminus and/or discharge terminus, may be positioned at a depth of 1 m or more; 2 m or more; 3 m or more; 4 m or more; 5 m or more; 6 m or more; 7 m or more; 8 m or more; 9 m or more; 10 m or more; 11 m or more; 12 m or more; 13 m or more; 14 m or more; 16 m or more; 17 m or more; 18 m or more; 19 m or more; 20 m or more; 25 m or more; 30 m or more; 35 m or more; 40 m or more; 45 m or more; 50 m or more; 60 m or more; 70 m or more; 80 m or more; 90 m or more; 100 m or more; 200 m or more; and/or 300 m or more in a water source. In some aspects, multi-lumen conduits include an intake lumen and/or at least one portion thereof, e.g., an intake terminus, and/or a discharge lumen, or a portion thereof, such as a terminal end or a portion thereof, e.g., a discharge terminus, positioned below and/or within a particular zone (e.g., euphotic and/or disphotic, and/or aphotic zone and/or benthic zone) in a water source. Multi-lumen conduits, in certain versions, include an intake lumen and/or at least one portion thereof, e.g., an intake terminus, and/or a discharge lumen, or a portion thereof, such as a terminal end or a portion thereof, e.g., a discharge terminus, positioned below the photic zone in a cool water source.

In certain aspects wherein an intake lumen is positioned at a particular depth within a cool water source (e.g., a depth of 15 m or more), its center (e.g., the center-most point of an intake lumen or a portion thereof, such as an intake terminus) and/or the top edge (e.g., the edge or portion closest to the surface of the water) of the intake lumen and/or the bottom edge (e.g., the edge or portion furthest from the surface of the water) of the intake lumen is positioned at that particular depth below the surface of the water. In certain instances, an intake lumen positioned at a particular depth within a water source may have an opening, such as a terminal opening, e.g., an opening at an intake terminus, wherein the center of the opening (e.g., the center-most point of a circular and/or square opening) and/or the top edge (e.g., the edge or portion closest to the surface of the water) of the opening and/or the bottom edge (e.g., the edge or portion furthest from the surface of the water) of the opening is positioned at that particular depth below the surface of the water.

In certain variations of the disclosed systems wherein a discharge lumen is positioned at a particular depth within a water source (e.g., a depth of 15 m or more), its center (e.g., the center-most point of a water discharge) and/or the top edge (e.g., the edge or portion closest to the surface of the water) of the discharge lumen and/or the bottom edge (e.g., the edge or portion furthest from the surface of the water) of the discharge lumen is positioned at that particular depth below the surface of the water. In certain aspects, a discharge lumen positioned at a particular depth within a water source may have an opening wherein the center of the opening (e.g., the center-most point of a circular and/or square opening) and/or the top edge (e.g., the edge or portion closest to the surface of the water) of the opening and/or the bottom edge (e.g., the edge or portion furthest from the surface of the water) of the opening is positioned at that particular depth below the surface of the water.

Multi-lumen conduits and/or intake lumens and/or discharge lumens thereof may, in various embodiments, be composed of one or more materials or one or more types of materials. Examples of materials that the multi-lumen conduits of the disclosed systems may be composed of include polymers, ceramics, metals, glasses and/or a combination thereof. In some instances, the multi-lumen conduits are not composed of metal or material that is subject to corrosion (e.g., corrosion by rust). In some embodiments, multi-lumen conduits are composed of plumbing materials. For example, multi-lumen conduits may be composed of polyvinyl chloride (PVC) pipes and/or joints and one or more adhesives for fastening the pipes in a water-tight manner. Where appropriate, one or more materials of the multi-lumen conduits may be rigid. In some aspects, one or more materials of the multi-lumen conduits may be flexible (e.g., one or more rubber tubes or hoses). However, these examples of materials are not limiting and the materials of the multi-lumen conduits may be any material, or combination of materials, having the structural and chemical properties necessary to function in the disclosed systems as described herein.

Power Plant

In certain versions, the subject facilities are power plants. As noted above, power plants are facilities configured for the generation of electric power. Accordingly, in particular aspects, power plants house, e.g., fully contain therein, components for generating and transmitting electric power.

Power plants, in some embodiments, generate electrical power from fossil fuels, e.g., coal, oil, and/or natural gas, nuclear power and/or renewable energy sources e.g., wave, tidal, wind and/or solar sources. In certain aspects, power plants are commercial and/or industrial-scale power plants and may provide electric power to consumers of electric power outside the power plant. In various versions, a power plant is connected to an electrical power grid, e.g., a community electrical grid, and/or transmits electrical power to and/or through an electrical power grid e.g., a community electrical grid. By "community electrical grid" is meant an electrical network for supplying electrical power to a community of consumers, such as 100 or more, 1,000 or more, or 10,000 or more, residential, commercial, and/or industrial power consuming units.

In various aspects, a power plant is an industrial power station, e.g., a full-scale industrial power station, such as a power station configured to generate electric power in a large amount, e.g., 500 MW or more, 2 gW or more, or 10 gW or more, and/or provide it to a community electrical grid. In addition, a power plant may have an electrical connection to a power grid and/or may be configured to transfer a large amount, e.g., 10% or more, 50% or more, or 90% or more of the power plant's total potential electrical output of electrical power to and/or from the grid. In some aspects a power plant may not have a direct operable, e.g., electrical, connection to a power grid but may have an operable, e.g., electrical, connection to a power grid via a separate facility, e.g., a desalination plant and/or a data center, which is operably connected to, and/or co-located with, the power plant.

Certain aspects of the subject power plants include an intake for receiving materials, such as fuel, and/or energy into the power plant. In some aspects, power plants include at least one conversion element for converting the materials, such as fuel, and/or energy received into the intake to electric power. In select instances, power plants include an electrical yield component configured for providing an output of electrical power from the plant. In various embodiments, power plants include one or more control systems configured for controlling the amount of materials, such as fuel, and/or energy received into an intake and/or for controlling the amount of materials, such as fuel, and/or energy converted to electric power and/or for controlling the amount of electric power output through the electrical yield component.

Power plants, in some instances, produce carbon emissions. In certain versions, power plants, e.g., power plants operating to produce electric power independently, produce an amount of carbon emissions for each function or portion of a function performed by the power plant or components thereof. For example, in some embodiments, power plants produce a certain amount of carbon emissions per amount of electrical power produced.

Where desired, power plants include electrical components. For example, power plants may include temperature and/or lighting control systems as well as electrical components for electrically connecting consumers of electrical power to the power plant. In select instances, power plants (e.g., power plants operating independently) use an amount of energy (e.g., electrical energy) for each amount of electrical power produced.

Some variations of power plants produce heat. As such, in certain embodiments, power plants include a water cooling subsystem and/or a multi-lumen conduit. As such, in some versions, power plants produce and output warm water. Water cooling subsystems and/or a multi-lumen conduits of power plants may be configured to cool the power plants and may have any of the characteristics described herein.

In particular embodiments, a first facility, e.g., a power plant, is co-located with and/or operably coupled to one or more other facilities, e.g., a water desalination plant and/or a data center. In other embodiments, a first facility, e.g., a power plant, is not co-located with and/or is not operably coupled to one or more other facilities, e.g., a water desalination plant and/or a data center. In some aspects, power plants may be in fluid communication with a data center and/or a water desalination plant. Where desired, power plant water cooling subsystems may be attached to a coupling component (e.g., a pipe section) and/or in interconnected desalination structure of a water desalination plant such that water (e.g., warm water) may move (e.g., flow) from the power plant to the desalination plant. In some aspects, one or more coupling components are positioned within a desalination plant and/or within a power plant and/or between a desalination plant and a power plant (e.g., at the interface of a desalination and power plant). In some versions, power plant water cooling subsystems may be attached to a water cooling subsystem of a data center such that a produced fluid, e.g., water, may move (e.g., flow) from a power plant to a data center and/or from a data center to a power plant.

Certain embodiments of power plants provide electrical power to one or more other facilities, e.g., data centers (e.g. data centers co-located with power plants and/or desalination plants) and/or desalination plants (e.g., desalination plants co-located with power plants and/or data centers). As such, some versions of the disclosed facilities include power plants that are electrically connected (e.g., connected by at least one conductive material, such as a metal cable) to a data center and/or a water desalination plant. In certain aspects, power plants may provide all or a portion of the electrical power required to operate one or more other facility, e.g., a data center and/or a desalination plant, and/or the electrical components therein.

Some versions of the disclosed systems that include a power plant co-located with a data center and/or a desalination plant are configured to produce fewer carbon emissions as compared to the same power plant, data center and water desalination plant operating independently (e.g., a power plant, data center and water desalination plant not connected in a manner such that water and/or electricity may travel from one to the other). Also, some variations of the disclosed systems that include a power plant co-located with a data center and/or a desalination plant are configured to use less energy (e.g., electrical energy) as compared to the same power plant, data center and water desalination plant operating independently (e.g., a power plant, data center and water desalination plant not connected in a manner such that water and/or electricity may travel from one to the other). As such, certain versions of the disclosed systems that include a power plant co-located with a data center and/or a desalination plant are configured to be more energy-efficient than the same power plant, data center and water desalination plant operating independently.

Data Center

In certain embodiments, the subject facilities are data centers. As noted above, the term "data center" refers to a facility configured and/or used for physically housing (e.g., containing within it) one or more computer systems and/or associated components, such as a server farm. In certain embodiments, data centers include the components therein and manage, store, process and/or exchange digital information and data. In some instances, data centers are co-located with and/or operably connected to one or more other facilities, such as one or more power plants and/or water desalination plants.

Various embodiments of data centers include computers, data storage devices, servers (e.g., web servers, database servers and/or application servers), switches, routers, vaults, load balancers, racks, wire cages or closets and/or related equipment. Data centers may also include redundant data communications connections, backup or redundant power supplies, security devices, and/or fire suppression systems. In some instances, data centers include data storage systems and/or telecommunications systems.

As noted above, in some versions, the subject facilities include one or more server farm. In some embodiments, server farms are composed of a plurality of computers and/or a plurality of computer servers. For example, a server farm may include 5 or more; 100 or more; 1000 or more; or 10,000 or more computers and/or computers servers which may be operably coupled to one another. Such a grouping of computer servers may be configured to operate to have a performance and/or produce an output greater than that of a single server.

Certain versions of data centers are used for providing application services or management for various types of data processing (e.g., intranet, web hosting internet). In particular embodiments, data centers are used, for example, to operate and manage one or more carriers' telecommunication network, provide data center applications directly to one or more carriers' customers and/or provide hosted applications for one or more third parties to provide services to customers.

Embodiments of data centers include data centers that are within one or more buildings. In certain aspects, data centers occupy one or more rooms of a building, one or more floors of a building or an entire building.

In some aspects, data centers and/or components therein, e.g., server farms, are electrically powered. For example, certain embodiments of data centers consume electricity to operate. Power draw for data centers may range from a few kW (e.g., one, two, three, four or five kW) to several tens of MW (e.g., one, two, three, four, five, six, seven, eight or nine tens of MW) for larger facilities. In certain aspects of data centers, the data centers have power densities of more than one-hundred times that of an average office building. In some embodiments of data centers, electricity costs are the primary operating expense of the data center and may account for 10% or more of a data center's total cost of ownership. Embodiments of data centers are operably connected to at least one power source, e.g., one or more power plants, as described herein.

Certain versions of the subject data centers use an amount of energy for each function performed by the data center or components thereof. For example, data centers or systems including data centers may use a specific amount of energy per amount of data center cooling. In some aspects, data centers or systems including data centers have a degree of energy efficiency that may be quantified as the power usage effectiveness (PUE) of the data center or system including a data center (e.g., a PUE of 1.0; 1.1; 1.2; 1.3; 1.4; 1.5; 1.6; 1.7; 1.8; 1.9; or 2.0). The PUE is the ratio of the total power entering a system (e.g., a data center and optionally, a desalination plant and/or a data center power source, such as a power plant) to the power used by the computer systems and/or associated components (e.g., information technology equipment) within the system (e.g., the data center). In various aspects, a PUE is the inverse of the data center infrastructure efficiency (DCiE). In some versions, systems (e.g., data centers) have a PUE of 2.0 or less, or less than 2, such as 1.9 or less, e.g., 1.8, 1.7, 1.6, 1.5, 1.4, 1.3, 1.2 or 1.1 or less (e.g., a PUE ranging from 1.0 to 2.0). In some embodiments, a system (e.g., a data center) has a PUE ranging from 1.0 to 1.3. In some instances, a system, (e.g., a data center) has a PUE of or about 1.0, where a PUE of or about 1.0 is a PUE near, and greater than, 1.0 (e.g., 1.01 or 1.02 or 1.03 or 1.04 or 1.05 or 1.06 or 1.07 or 1.08 or 1.09 or 1.1 or 1.15 or 1.2 or 1.25 or 1.3 and/or within the range 1.01 to 1.30). In determining the PUE of data centers of the invention, one may factor in a component that represents the reduced energy used by the desalination plant in desalinating the warm water output of the data center cooling subsystem. Any convenient protocol for factoring in this component into the PUE determination may be employed. For example, the reduction in energy used by the desalination plant resulting from co-location of the desalination plant with the data center (and particularly by using the warm output water from the data center) may be added to the amount of energy input into the data center which is used by the computer systems and/or associated components (e.g., server farm and/or information technology equipment). One particular formula that may be employed is:

PUE=Total Facility Power/IT Equipment Power

In the above formula for PUE, total facility power includes cooling and lighting, as well as anything that is not considered a computing device, whereas IT equipment is computing devices A PUE of 1.0 is ideal meaning that all the power is going to computing devices. A PUE of less than 2.0 is desirable, but more ideally less than 1.5, and more optimally less than 1.1, and optimally below 1.01. By performing the cooling with cool sea water, then only the cost of pumping the water adds to total facility power.

In some embodiments, data centers and/or power sources of data centers, such as power plants, produce carbon emissions. In certain aspects, data centers (e.g., data centers operating independently) produce an amount of carbon emissions for each function or portion of a function performed by the data center or components thereof.

Data centers and/or components therein, e.g., server farms, in certain instances, produce heat. As such, certain versions of data centers and/or server farms include environmental control systems (e.g., one or more air conditioning units) for controlling at least a portion of the environment with a data center. In some aspects, environmental control systems include water cooling subsystems. In some instances, water cooling subsystems are configured to heat and/or cool at least a portion of the data centers.

In some instances, environmental control systems include humidity control systems that are configured to control the amount of humidity in at least a portion of the data centers. In some aspects, environmental control systems include pressure control systems that are configured to control the pressure level in at least a portion of the data centers. Some versions of environmental control systems are configured to maintain at least a portion of a data center and/or computer related equipment therein at a temperature between the inclusive range of 16° C. and 24° C. (e.g., 17° C.; 18° C.; 19° C.; 20° C.; 21° C.; 22° C. or 23° C.) and/or within an inclusive humidity range of 40%-55% and/or with a maximum dew point of 15° C.

In various instances, data centers include one or more water cooling subsystems and/or multi-lumen conduits, e.g., a multi-lumen conduit operably coupling, e.g., fluidically coupling, a water cooling subsystem and a cool water source, e.g., an ocean or sea. Water cooling subsystems and/or multi-lumen conduits of the subject data centers, in various embodiments, include each, or any combination of the characteristics of the water cooling subsystems described herein.

Water Desalination Plant

In various instances, a facility may be a desalination plant. As used herein, the term "desalination plant" refers to a facility configured and/or used for desalinating water. In some embodiments, desalination plants house components for desalinating water.

Embodiments of the subject desalination plants operate by distillation (e.g., vacuum distillation). Desalination plants may be configured to boil water (e.g., salt water) and collect water (e.g., water vapor) having a significantly reduced or eliminated salt concentration. Desalination plants, in certain aspects, boil water at less than atmospheric pressure. In some versions, desalination plants operate by multistage flash distillation. As such, desalination plants may be configured to operate by one or more processes that distill water (e.g., seawater) by flashing an amount of water into steam in multiple stages of concurrent heat exchangers. In particular instances, desalination plants using distillation (e.g., vacuum distillation) employ heated water (e.g., warm water) in one or more processes. Certain variations of desalination plants are configured to desalinate water by using both distillation and reverse osmosis processes.

In various embodiments, desalination plants of the disclosed systems are reverse osmosis desalination plants. In some aspects, reverse osmosis desalination plants use pressure and/or one or more semipermeable membranes to desalinate water. In certain versions of reverse osmosis desalination plants, water is passed through one or more semipermeable membranes in order to remove salt and/or minerals and/or other impurities therefrom. In some instances, the efficiency of a desalination process of a reverse osmosis desalination plant is higher if the temperature of the water input (e.g., saltwater) into the desalination process is higher. In various embodiments, a desalination process of a reverse osmosis desalination plant uses less energy per volume of water desalinated if the temperature of the water input (e.g., saltwater) into the desalination process is higher.

By desalinating water, in some aspects, desalination plants produce a fluid, such as desalinated water and/or brine (e.g., both desalinated water and brine). As used herein, the term "brine" refers to a solution discharged from a desalination plant. In certain aspects, brine may be a solution (e.g., a concentrate) including salt (e.g., sodium chloride) and water. In some versions, brine has a salt concentration in the range 3.5% to 26%, such as from 5% to 25% or 10% to 20%. In certain embodiments, brine includes one or more of the impurities removed from water during desalination (e.g., minerals or other components). In some instances, brine may include residues of chemicals used to treat (e.g., clean) a desalination plant.

Embodiments of desalination plants include at least one filter configured for purifying water. In some aspects, the at least one filter of the water intakes includes one or more semipermeable membranes.

In some instances, desalination plants are configured such that an amount of water may move through the plants. In certain embodiments, desalination plants are configured such that an amount of water may move through the plants by traveling through an interconnected desalination structure of operably connected pipes and/or containers. The interconnected desalination structure of operably connected pipes and/or containers, in certain variations, is composed of the same and/or different materials or types of materials as the water cooling subsystems described above. In some versions, a desalination plant, or component thereof, e.g., an interconnected desalination structure, is operably connected to a water cooling subsystem, e.g., a water cooling subsystem of a power plant. Where desired, a water desalination plant, or a portion thereof, e.g., an interconnected desalination structure, is configured to receive warm water which is output from a water cooling subsystem. In particular embodiments, a facility, e.g., a power plant, or a component thereof, e.g., the interconnected desalination structure of operably connected pipes and/or containers of a desalination plant, is connected to and/or includes a coupling component for receiving water from a water source, e.g., a water cooling subsystem. In some embodiments, a facility, or a component thereof, e.g., the interconnected desalination structure of operably connected pipes and/or containers of a desalination plant is connected to and/or includes a water discharge, e.g., a conduit, for discharging water from the facility e.g., the desalination plant. Such a discharge may be operably coupled to a multi-lumen conduit or component thereof, e.g., a discharge lumen.

In particular versions, facilities such as desalination plants include one or more valves for controlling the movement of water through the facility, e.g., the desalination plant, (e.g., through an interconnected desalination structure of operably connected pipes and/or containers within a desalination plant). In some embodiments, the valves are controllable (e.g., configured to be opened and/or closed in reaction to a designated signal or action). In some aspects each valve is individually controllable (e.g., a valve may be opened and or closed while other valves are not). In certain instances, the one or more valves include electrical components and may be configured to receive an electronic signal from a controller operably connected thereto.

In various aspects, a desalination plant is configured such that water can move (e.g., flow) into the plant from a water source (e.g., a cool water source, and/or a water cooling subsystem). In some embodiments, the water source of a water desalination plant is the water cooling subsystem of a power plant (e.g., a co-located power plant). As such, where desired, water desalination plants may be configured to receive warm water from water cooling subsystems or a portion thereof (e.g., a warm water emitter) and/or another source (e.g., a data center). In some embodiments, water desalination plants are configured such that warm water received into a desalination plant is used in one or more water desalination processes therein.

In certain versions, desalination plants include one or more coupling components. Coupling components may include one or more conduits, such as one or more pipes, and may be configured for connecting, e.g., operably connecting, to and receiving water from a water cooling subsystem. In some aspects, one or more coupling components are positioned within a facility, e.g., a desalination plant, and/or within a power plant and/or between a desalination plant and a power plant (e.g., at the interface of a desalination plant and power plant) and/or another facility. In certain instances, the one or one or more coupling components are a pipe or a series of pipes for providing fluid communication between facilities, e.g., a desalination plant and a power plant. In some embodiments, the one or more coupling components are operably connected (e.g., attached in a water-tight manner) to a warm water emitter of a power plant. The one or more coupling components may be operably connected to a multi-lumen conduit, or component thereof, e.g., an intake lumen and/or discharge lumen, as described herein. As such, water (e.g., cool water) may be added to the warm water passing out of the water cooling subsystem of a facility, e.g., a power plant, before it enters another facility, e.g., a desalination plant. The one or more coupling components may also be operably connected to a water discharge, as described herein. As such, all or a portion of the water channeled to flow through the coupling component may be channeled to flow into a water source and all or a portion of the water channeled to flow through the coupling component may be channeled to flow into a facility, e.g., a water desalination plant. The one or more coupling components may also be operably connected to one or more other coupling components.

In certain embodiments, coupling components and/or interconnected desalination structures are configured to have an amount of water (e.g., seawater) move (e.g., flow) through them per time period (e.g., minute or hour or day). For example, coupling components and/or interconnected desalination structures may be configured to have the following amounts of water move (e.g., flow) through them: 5,000 L/day or less; 100,000 L/day or less; 1 million L/day or less; 100 million L/day or less; 500 million L/day or less; or 1 billion L/day or less. Coupling components may also be configured to have more than 1 billion L/day of water move (e.g., flow) through them. Coupling components and/or interconnected desalination structures, in particular embodiments, may be configured to have an amount of water move through them wherein the amount is in any of the inclusive ranges: 5,000 L/day to 1 billion L/day; 5,000 L/day to 1 million L/day; 5,000 L/day to 100 million L/day; or 80 million L/day to 100 million L/day. In some aspects, the amount of water moving (e.g., flowing) through a coupling component and/or interconnected desalination structure is variable within a time period (e.g., one minute, one hour, one day, one month, one year).

Some embodiments of desalination plants are configured such that brine moves (e.g., flows) out of a desalination plant through a water discharge and/or a discharge lumen of a multi-lumen conduit. In certain instances, desalination plants, or components thereof, such as interconnected desalination structures, are operably connected to (e.g., in fluid communication with) water discharges and/or a discharge lumen of a multi-lumen conduit, as described herein.

A desalination plant, in various aspects, is configured such that desalinated (e.g., water having a low salt concentration) moves out of the desalination plant through a water expulsion aspect. The water expulsion aspect may be one or more pipes and/or may be operably coupled to an interconnected desalination structure. The water expulsion aspect may also be configured to transport the desalinated water to a location where the desalinated water may be used and/or stored. The water expulsion aspect may, in certain aspects, also be configured to transport the desalinated water to a location from which the desalinated water can be further transported.

The subject facilities, including desalination plants, in certain versions, include one or more pump. In some embodiments, a pump is a means for causing water to move through facilities, such as desalination plants and/or other facilities and/or components (e.g., data centers; water cooling subsystems; and/or multi-lumen conduits), as described herein. In particular instances, a pump causes water to move unidirectionally or bidirectionally through desalination plants and/or other facilities and/or components, as described herein. In some embodiments, a pump is electrically powered and/or gasoline powered and/or powered by another means. In certain aspects, a pump is operably connected to a power plant or another power source (e.g., the power source of a data center), as described herein. In particular embodiments, tides, and/or a pump powered by tides, cause water to move through the subject facilities, e.g., desalination plants and/or other components (e.g., power plants) described herein. In some embodiments, one or more pumps are located within the subject facilities, such as power plants and/or desalination plants, as described herein. In certain versions, one or more pumps are located outside the subject facilities, such as power plants and/or desalination plants, as described herein.

Where desired, facilities, such as desalination plants include electrical components. For example, facilities, such as desalination plants may include temperature and/or lighting control systems as well as electrical systems for desalinating water. In certain aspects, facilities, such as desalination plants (e.g., desalination plants operating independently) use an amount of energy (e.g., electrical energy) for each volume of water desalinated.

As such, the subject facilities, such as desalination plants may be operably connected to at least one power source (e.g., one or more power plant, as described herein). In certain aspects, the subject facilities, such as desalination plants may be operably connected (e.g., electrically connected) to a data center or one or more of the components thereof.

In certain versions, facilities, such as desalination plants and/or power sources thereof produce carbon emissions. In certain aspects, facilities, such as desalination plants, produce an amount of carbon emissions for each function or portion of a function performed by the facility, e.g., desalination plant, or components thereof. For example, in some embodiments, desalination plants produce a certain amount of carbon emissions per volume of desalinated water produced.

The disclosed subject matter, in certain instances, includes one or more facilities co-located with one or more other facilities, such as one or more desalination plants co-located with one or more power plants. As noted above, certain embodiments of the disclosed facilities include desalination plants that are configured to receive and desalinate warm water output from a power plant (e.g., a co-located power plant). Certain variations of the disclosed facilities that include desalination plants configured to receive and desalinate warm water output from a power plant and/or data center are thereby configured to produce fewer carbon emissions as compared to the same power plant and/or data center and water desalination plant operating independently (e.g., a power plant and water desalination plant not connected in a manner such that water or electricity may travel from one to the other). Also, in some instances, the disclosed facilities include desalination plants that are configured to receive and desalinate warm water output from a power plant and are thereby configured to use less energy (e.g., electrical energy) as compared to the same power plant and water desalination plant operating independently (e.g., a power plant and water desalination plant not connected in a manner such that water or electricity may travel from one to the other).

Methods

Aspects of the present disclosure include methods for cooling facilities, e.g., power plants and/or data centers, such as data centers including one or more server farms. In some versions, the methods also include desalinating water. In certain embodiments, the methods have steps (e.g., sequential steps and/or simultaneous steps) including (1) receiving cool water into a water cooling subsystem of a facility via a multi-lumen conduit fluidically coupling the water cooling subsystem and a cool water source, such as an ocean or sea; and (2) outputting warm water from the water cooling subsystem.

The term "cooling" is used broadly and generically to refer to lowering the temperature of an aspect, e.g., a facility, such as a data center and/or power plant or a portion of one or more components therein, or a portion of an aspect, e.g., a portion of a power plant that is heated by one or more components of the power plant. As such, in some embodiments, cooling a facility, e.g., a data center, with a water cooling subsystem includes lowering the temperature of at least a portion of the facility or one or more components of the facility, e.g., a server farm, using a water cooling subsystem.

In versions of the methods which include receiving cool water into a water cooling subsystem of a facility, the water cooling subsystems may include any characteristic or combination of characteristics of the water cooling subsystems described above. Also, as noted above, in certain variations of the methods, water is received into a water cooling subsystem via a multi-lumen conduit. Such a multi-lumen conduit may include any characteristic or combination of characteristics of the multi-lumen conduits described above.

In various embodiments of the subject methods, receiving water, e.g., cool water, into an element, e.g., a water cooling subsystem, may include having water moved, e.g., pumped, into that element and/or containing the water within that element. In addition, in embodiments of the methods which include outputting water, e.g., warm water, from an element, e.g., a water cooling subsystem, outputting water may include moving, e.g., pumping, water out of that element. In some embodiments, outputting warm water from a facility, e.g., outputting warm water from a water cooling subsystem of a facility, includes receiving the warm water into a separate facility e.g., a water desalination plant. Outputting warm water from a facility may also include desalinating the water with, for example, a water desalination plant.

In some aspects, multi-lumen conduits as applied in the subject methods include an intake lumen and/or a discharge lumen. In some embodiments, cooling a facility includes moving, e.g., intermittently or continually pumping, a fluid, e.g., a produced fluid and/or water, e.g., cool water, into, out of and/or through at least a portion of a water cooling subsystem and/or multi-lumen conduit. For example, cooling a facility may include moving cool water into a water cooling subsystem via a multi-lumen conduit and/or out of the facility. Cooling a facility may, in some embodiments, also include moving, e.g., discharging a produced fluid, e.g., brine, into and/or out of a multi-lumen conduit or portion thereof, e.g., a discharge lumen and/or discharge terminus. In embodiments where a produced fluid is moved, e.g., pumped, into a multi-lumen conduit of a facility, the produced fluid may be produced by the facility and/or by a separate facility, e.g., a desalination plant, co-located with the facility including the multi-lumen conduit.

In some embodiments, the methods include intaking and/or receiving, water, e.g., cool water, into a multi-lumen conduit, or a portion thereof, e.g., an intake lumen. In some versions, the subject methods include discharging and/or expelling, a fluid, e.g., a produced fluid, e.g., brine and/or warm water, from a multi-lumen conduit, or a portion thereof, e.g., discharge lumen. In some versions, the methods include discharging a produced fluid from a multi-lumen conduit via a discharge terminus of the conduit. Where desired, the methods include simultaneously intaking and/or receiving, water, e.g., cool water, into a multi-lumen conduit, or a portion thereof, e.g., an intake lumen, and discharging and/or expelling, a fluid, e.g., a produced fluid, e.g., brine and/or warm water, from a multi-lumen conduit, or a portion thereof, e.g., discharge lumen.

The subject methods also include methods wherein a multi-lumen conduit includes an intake terminus and a discharge terminus, and wherein the discharge terminus is positioned at a different location than the intake terminus. As such, the subject methods include intaking and/or receiving, water, e.g., cool water, into a multi-lumen conduit, or a portion thereof, e.g., an intake lumen and/or intake terminus, and discharging and/or expelling, a fluid, e.g., a produced fluid, e.g., brine and/or warm water, from a multi-lumen conduit, or a portion thereof, e.g., discharge lumen and/or discharge terminus, at a different location than where the water is received into the multi-lumen conduit. When desired, such intaking and discharging can be performed simultaneously.

In various embodiments of the subject methods, an intake lumen of a multi-lumen conduit is co-axial and/or substantially co-axial with a discharge lumen of the conduit. As such, the subject methods include placing an intake lumen and a discharge lumen of a multi-lumen conduit in so that they are co-axial with one another. In some versions, the methods include positioning an intake lumen of a multi-lumen conduit entirely within or at least partially within a discharge lumen of the multi-lumen conduit. Some embodiments of the methods also include positioning a discharge lumen of a multi-lumen conduit entirely within or at least partially within an intake lumen of the multi-lumen conduit. Furthermore, where desired, the methods include multi-lumen conduits having an intake lumen adjacent to a discharge lumen. As such, the methods also include positioning an intake lumen of a multi-lumen conduit adjacent to a discharge lumen of a multi-lumen conduit.

In some versions, the methods include absorbing heat produced by a facility, e.g., a power plant and/or data center, using a water cooling subsystem and/or water pumped through the subsystem. As such, in some versions, the methods include employing a water cooling subsystem to absorb heat produced by a facility. In certain instances, cooling a facility, e.g., cooling the facility with a water cooling subsystem, includes moving, e.g., pumping, water, e.g., warm water, through at least a portion of the water cooling subsystem after the water cooling subsystem and/or water therein has absorbed heat produced by the facility. In various embodiments, cooling a facility with a water cooling subsystem includes moving, e.g., outputting and/or pumping, water, e.g., warm water, out of the water cooling subsystem, e.g., pumping water through a warm water emitter of a water cooling subsystem. In some variations, cooling a facility with a water cooling subsystem includes moving, e.g., pumping, water, e.g., warm water, into a separate facility e.g., a desalination plant and/or a data center, and/or desalinating the water.

The word "desalinating" is used broadly and generically to refer to conducting one or more processes (e.g., reverse osmosis) to desalinate water. As such, in some embodiments, desalinating water includes receiving water (e.g., warm water) from a facility or a portion thereof, e.g., a warm water emitter into a desalination plant (e.g., a desalination plant co-located with a power plant) and conducting one or more desalination processes to desalinate the water. In some embodiments of the disclosed methods, cooling a first facility and/or desalinating salt water includes co-locating and/or operably connecting a first facility, e.g., a power plant and/or data center, and a second facility, e.g., a desalination plant. In some instances, desalinating water includes moving (e.g., intermittently or continually pumping) water (e.g., warm water) through one or more components of a desalination plant and thereby desalinating the water.

In certain versions of the disclosed methods, cooling a facility, such as a power plant and/or desalinating water, e.g., salt water, includes obtaining (e.g., intermittently or constantly pumping) water (e.g., seawater) into, through, and/or from, a multi-lumen conduit or a portion thereof, e.g., an intake lumen. Particular variations of the disclosed methods include positioning a multi-lumen conduit or a portion thereof, e.g., an intake lumen and/or a discharge lumen and/or an intake terminus and/or a discharge terminus, at a particular depth within a water source (e.g., below the photic zone of a water source). In some aspects of the disclosed methods, a water source is an ocean or sea.

In certain aspects of the disclosed methods, cooling a facility and/or desalinating water with a water desalination plant includes generating a produced fluid, e.g., brine and/or warm water. Also, in some versions of the methods, cooling a facility includes discharging (e.g., intermittently or constantly moving) a produced fluid, e.g., brine, into a body of water (e.g., an ocean or sea). Discharging a produced fluid, e.g., brine, for example, from a desalination plant, may be via a multi-lumen conduit. Particular versions of the disclosed methods include discharging brine at a particular depth within a body of water (e.g., within or below the photic zone of an ocean or sea).

The disclosed methods, in some embodiments, include positioning a multi-lumen conduit or a portion thereof, e.g., an intake lumen and/or a discharge lumen and/or an intake terminus and/or a discharge terminus, and/or discharging brine, e.g., discharging brine via a water discharge, at a depth of 15 m or more in a water source. Some variations of the methods include positioning a multi-lumen conduit or a portion thereof, e.g., an intake lumen and/or a discharge lumen and/or an intake terminus and/or a discharge terminus, and/or discharging brine at a depth of 1 m or more; 2 m or more; 3 m or more; 4 m or more; 5 m or more; 6 m or more; 7 m or more; 8 m or more; 9 m or more; 10 m or more; 11 m or more; 12 m or more; 13 m or more; 14 m or more; 16 m or more; 17 m or more; 18 m or more; 19 m or more; 20 m or more; 25 m or more; 30 m or more; 35 m or more; 40 m or more; 45 m or more; 50 m or more; 60 m or more; 70 m or more; 80 m or more; 90 m or more; 100 m or more; 200 m or more; and/or 300 m or more in a body of water (e.g., an ocean or sea). In certain instances, the disclosed methods include positioning a multi-lumen conduit or a portion thereof, e.g., an intake lumen and/or a discharge lumen and/or an intake terminus and/or a discharge terminus, and/or discharging brine below and/or within a particular zone (e.g., euphotic and/or disphotic, and/or aphotic and/or benthic zone) in a body of water (e.g., an ocean or sea).

In certain variations of the methods, positioning a multi-lumen conduit or a portion thereof, e.g., an intake lumen and/or a discharge lumen and/or an intake terminus and/or a discharge terminus, and/or discharging brine, at a particular depth within a water source (e.g., a depth of 15 m or more), includes positioning the center of the multi-lumen conduit or a portion thereof, e.g., an intake lumen and/or a discharge lumen and/or an intake terminus and/or a discharge terminus, (e.g., the center-most point of an intake lumen and/or discharge lumen) and/or the top edge (e.g., the edge or portion closest to the surface of the water) of the multi-lumen conduit or a portion thereof, e.g., an intake lumen and/or a discharge lumen and/or an intake terminus and/or a discharge terminus, and/or the bottom edge (e.g., the edge or portion furthest from the surface of the water) of the multi-lumen conduit or a portion thereof, e.g., an intake lumen and/or a discharge lumen and/or an intake terminus and/or a discharge terminus, at that particular depth below the surface of the water. Where desired, a multi-lumen conduit or a portion thereof, e.g., an intake lumen and/or a discharge lumen and/or an intake terminus and/or a discharge terminus, positioned at a particular depth within a water source may have an opening wherein the center of the opening (e.g., the center-most point of a circular and/or square opening) and/or the top edge (e.g., the edge or portion closest to the surface of the water) of the opening and/or the bottom edge (e.g., the edge or portion closest to the surface of the water) of the opening is positioned at that particular depth below the surface of the water.

The desalination plant, in some aspects of the methods, is a reverse osmosis desalination plant. As such, in certain instances, water is desalinated using one or more reverse osmosis processes. In some embodiments, water (e.g., warm water) is desalinated by passing the water through one or more semipermeable membranes in order to remove salt and/or minerals and/or other impurities therefrom.

In some embodiments, facilities such as power plants, data centers, and/or desalination plants produce carbon emissions. In certain aspects, power plants, and/or data centers and/or desalination plants (e.g., desalination plants operating independently) produce an amount of carbon emissions for each function or portion of a function performed by the facilities, e.g., a desalination plant, or components thereof. For example, in some variations, desalination plants produce a certain amount of carbon emissions per volume of desalinated water produced.

In addition, co-locating and/or operably connecting facilities, such as a power plant, and/or data center and/or desalination plant can reduce their overall carbon emissions. As such, in some instances, the disclosed methods of cooling a facility, e.g., a power plant, and/or data center and/or desalinating salt water at a desalination plant co-located with the power plant and/or data center produce fewer carbon emissions as compared to operating the same facility, e.g., power plant and/or data center, and water desalination plant independently (e.g., a power plant and water desalination plant not connected in a manner such that water or electricity may travel from one to the other). In certain variations, the disclosed methods of cooling a facility, such as a power plant and/or data center and/or desalinating salt water at a desalination plant co-located with the facility, e.g., power plant and/or data center include producing a smaller carbon footprint as compared to operating the same power plant and water desalination plant operating independently. In certain versions, the disclosed methods include obtaining power to operate a facility, e.g., a data center and/or a desalination plant from a power plant, such as a power plant co-located with the data center and/or the desalination plant.

In particular instances, facilities, e.g., power plants, data centers and/or water desalination plants, use an amount of energy for each function performed by the facilities or components thereof. For example, water desalination plants may use a specific amount of energy per amount of water desalinated.

In some embodiments, the methods include co-locating and/or operably connecting a first facility and one or more separate facilities. Co-locating and/or operably connecting a facility, e.g., power plant, data center and/or desalination plant can, in some embodiments, improve their overall energy efficiency. As such, the disclosed methods of cooling a facility, e.g., a power plant and/or data center, and/or desalinating salt water at a desalination plant co-located with the facility may use less energy per amount of facility cooling and per volume of water desalinated as compared to the same facility, e.g., power plant and/or data center, and water desalination plant operating independently (e.g., a data center and water desalination plant not connected in a manner such that water or electricity may travel from one to the other). In certain versions, the disclosed methods of cooling a facility, e.g., a power plant and/or data center, and/or desalinating salt water at a desalination plant co-located with the facility include cooling a facility, e.g., a power plant and/or data center, and desalinating water in a more energy-efficient manner as compared to operating the same power plant and/or data center and water desalination plant independently.

Where desired, the disclosed methods of cooling a facility, e.g., a power plant and/or data center and/or desalinating salt water at a desalination plant include maintaining a PUE (e.g., the PUE of the data center) at a particular value, such as 2.0 or less, e.g., 1.9, or less, 1.8 or less, 1.7 or less, 1.6 or less, 1.5 or less, 1.4 or less, 1.3 or less, 1.2 or less, 1.1 or less, where the particular value at which the data center is maintained may vary, e.g., a PUE of 1.0; 1.1; 1.2; 1.3; 1.4; or 1.5. In certain instances, the disclosed methods of cooling a facility, e.g., a power plant and/or data center, and/or desalinating salt water include maintaining the PUE (e.g., the PUE of the data center) within a particular range (e.g., 2 or below, below 2; between 0 and 2; or between 1 and 2). For example, in some aspects, the disclosed methods include maintaining the PUE (e.g., the PUE of the data center) between 1 and 1.3 and/or including 1 and 1.3, or at a value greater than 1 but approaching 1 (e.g., 1.1; 1.15; 1.2; 1.25; or 1.3).

In some instances, facilities such as data centers, desalination plants and/or power plants produce carbon emissions. In certain aspects, facilities such as power plants produce an amount of carbon emissions for each function or portion of a function performed by the facility or components thereof. For example, power plants may produce a certain amount of carbon emissions per amount of electrical power generated.

Also, co-locating and/or operably connecting a data center, desalination plant and/or power plant can reduce their overall carbon emissions. As such, in various instances, the disclosed methods of cooling a facility, such as a power plant and/or data center and/or desalinating salt water at a desalination plant co-located with the power plant and/or data center which include obtaining power to operate the data center and the desalination plant from a power plant co-located with the data center and/or the desalination plant produce fewer carbon emissions as compared to operating the same data center, water desalination plant and/or power plant independently. In some versions, the disclosed methods of cooling a facility, such as a power plant and/or data center and/or desalinating salt water at a desalination plant co-located with the power plant and/or data center by obtaining power to operate the data center and the desalination plant from a power plant co-located with the data center and/or the desalination plant include producing a smaller carbon footprint as compared to the independent operation of the same power plant and/or data center and water desalination plant.

In addition, co-locating and/or operably connecting a facility such as a power plant and/or data center and desalination plant can improve their overall energy efficiency. As such, in some instances, the disclosed methods of cooling a facility, such as a power plant and/or data center and/or desalinating salt water at a desalination plant co-located with the power plant and/or data center that include obtaining power to operate the data center and the desalination plant from a power plant co-located with the data center and the desalination plant use less energy per amount of power plant and/or data-center cooling or per volume of water desalinated than the same power plant and/or data center and water desalination plant operating independently (e.g., operating while not operably connected). In some versions, the disclosed methods of cooling a facility, such as a power plant and/or data center and/or desalinating salt water at a desalination plant co-located with the power plant and/or data center by obtaining power to operate the data center and the desalination plant from a power plant which is co-located with the data center and the desalination plant include cooling the power plant and/or data center, desalinating water and/or producing or obtaining power in a more energy-efficient manner as compared to operating the same power plant and/or data center and water desalination plant independently.

The disclosed methods of cooling a facility, such as a power plant and/or data center and/or desalinating salt water at a desalination plant co-located with the power plant and/or data center by obtaining power to operate the data center and the desalination plant from a power plant co-located with the data center and the desalination plant, in various embodiments, include maintaining a PUE (e.g., the PUE of the data center) at a particular value (e.g., any PUE value listed herein, or another PUE value) or within a range of particular values (e.g., any range of PUE values listed herein, or another range of PUE values).

Utility

The subject methods and associated facilities may be used to cool one or more facilities, such as power plants and/or desalination plants, and/or to desalinate water. Also, as described herein, in certain aspects, the disclosed subject matter may be applied to minimize the amount of space taken up by the facilities and/or their various components and/or to minimize the impact of the facilities on the surrounding environment.

More specifically, the disclosed facilities and methods may operate in such a way as to minimize the impact of facilities, such as power plants, water desalination plants, and/or data centers on the surrounding environment. The subject facilities may be applied to minimize the amount of space in the surrounding environment taken up by the facilities and/or their various components, such as a multi-lumen conduit and/or another means for inputting water into a facility and/or expelling water from the facility. For example, a multi-lumen conduit having one or more of the characteristics described herein, such as an intake lumen which is substantially co-axial with a discharge lumen, may be smaller and/or take up less space than a conduit not having such a characteristic. By minimizing the space taken up by the facilities and/or their various components, e.g., a multi-lumen conduit, the space may be utilized in other productive ways and the facility can therefore be made more cost-efficient than it would be otherwise.

Furthermore, in certain aspects, the disclosed facilities may be configured to operate in a way that is more effective than operating one or more facilities independently. For example, a power plant and/or data center, co-located with and operably connected to a desalination plant may allow the power plant and/or data center and/or desalination plant to use less energy per amount of electrical power generated and/or per amount of data center cooling and/or per volume of water desalinated as compared to the same power plant and/or data center and/or desalination plant operating independently. Additionally, operation of the disclosed facilities or utilization of the disclosed methods may result in a facility, e.g., a power plant and/or data center, and water desalination plant that produces fewer carbon emissions or less thermal pollution as compared to the same facility and water desalination plant operating independently.

Accordingly, the disclosed facilities and methods may be applied to minimize the amount of energy used by facilities such as power generation units, desalination plants and/or data centers. The subject facilities and methods may also be applied to minimize the amount of carbon emissions from power generation units, desalination plants and/or data centers. The disclosed subject matter is also useful in saving space for operations. By enhancing efficiency of operation and minimizing carbon emissions, the disclosed facilities and methods are useful to minimize costs associated with power generation units, desalination plants and/or data centers and to promote the quality of the surrounding environments.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims. It is also to be understood that the terminology used herein is for the purpose of describing particular embodiments only, and is not intended to be limiting, since the scope of the present invention will be limited only by the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A facility comprising:
   a water cooling subsystem;
   a water desalination plant operably coupled to and configured to receive and desalinate output warm water from the water cooling system; and
   a multi-lumen conduit comprising a fluid conveying structure comprising:
   an intake lumen comprising an intake opening positioned in an ocean or sea and configured to receive cool water from the ocean or sea and convey the received cool water to the water cooling subsystem; and
   a discharge lumen operably coupled to the water desalination plant and comprising a discharge outlet configured to discharge a produced warm fluid from the water desalination plant into the ocean or sea, wherein the discharge lumen is positioned at least partially within the intake lumen,
   wherein the facility is a power plant or a data center comprising a server farm.

2. The facility according to claim 1, wherein the produced warm fluid is brine.

3. The facility according to claim 1, wherein the water desalination plant is a reverse osmosis desalination plant.

4. The facility according to claim 1, wherein the multi-lumen conduit is configured for simultaneous bi-directional fluid flow.

5. The facility according to claim 1, wherein the intake lumen comprises an intake terminus and the discharge lumen comprises a discharge terminus at a different location in the ocean or sea than the intake terminus.

6. The facility according to claim 5, wherein the intake terminus is positioned below the photic zone in a water source.

7. The facility according to claim 5, wherein the discharge terminus is positioned below the photic zone in a water source.

8. The facility according to claim 1, wherein the intake lumen is substantially co-axial with the discharge lumen.

9. The facility according to claim 1, wherein the facility is a power plant and wherein the water cooling subsystem is configured to cool the power plant.

10. The facility according to claim 1, wherein the facility comprises a data center comprising a server farm and wherein the water cooling subsystem is configured to cool the server farm.

11. The facility according to claim 1, wherein the discharge lumen is configured to directly receive output warm water from the water cooling subsystem.

* * * * *